United States Patent
Shimoyama et al.

(10) Patent No.: US 9,645,032 B2
(45) Date of Patent: May 9, 2017

(54) PRESSURE-SENSITIVE SENSOR

(71) Applicant: The University of Tokyo, Tokyo (JP)

(72) Inventors: Isao Shimoyama, Tokyo (JP); Kiyoshi Matsumoto, Tokyo (JP); Binh-Khiem Nguyen, Tokyo (JP); Minh-Dung Nguyen, Tokyo (JP); Hoang-Phuong Phan, Tokyo (JP)

(73) Assignee: The University of Tokyo, Tokyo (JP)

( * ) Notice: Subject to any disclaimer, the term of this patent is extended or adjusted under 35 U.S.C. 154(b) by 98 days.

(21) Appl. No.: 14/655,831

(22) PCT Filed: Dec. 26, 2013

(86) PCT No.: PCT/JP2013/084804
§ 371 (c)(1),
(2) Date: Jun. 26, 2015

(87) PCT Pub. No.: WO2014/104163
PCT Pub. Date: Jul. 3, 2014

(65) Prior Publication Data
US 2015/0362394 A1 Dec. 17, 2015

(30) Foreign Application Priority Data

Dec. 28, 2012 (JP) .................................. 2012-286757
May 31, 2013 (JP) .................................. 2013-115612

(51) Int. Cl.
*G01L 9/00* (2006.01)
*G01L 19/04* (2006.01)
(Continued)

(52) U.S. Cl.
CPC ............ *G01L 19/04* (2013.01); *B81B 3/0027* (2013.01); *G01L 9/0001* (2013.01);
(Continued)

(58) Field of Classification Search
CPC . G01L 9/00; G01L 9/0001; G01L 9/02; G01L 9/04; G01L 9/06; G01L 9/08;
(Continued)

(56) References Cited

U.S. PATENT DOCUMENTS 3,279,245 A * 10/1966 Sidney Golden ......... G01L 1/02
338/5
3,628,373 A * 12/1971 Gilbert ................... G01N 13/04
356/445

FOREIGN PATENT DOCUMENTS

| JP | 56154638 A | * | 11/1981 | ............... G01L 9/04 |
| JP | 02120634 A | * | 5/1990 | ............ G01L 19/06 |

(Continued)

OTHER PUBLICATIONS

International Search Report dated Jan. 28, 2014 of international application No. PCT/JP2013/084804 (2 pages).
(Continued)

*Primary Examiner* — Nguyen Ha
(74) *Attorney, Agent, or Firm* — Fox Rothschild LLP; Robert J. Sacco; Carol E. Thorstad-Forsyth

(57) ABSTRACT

The present invention achieves a pressure-sensitive sensor which can detect information on a pressure, a sound pressure, acceleration, gas and the like, with high sensitivity. The pressure-sensitive sensor includes: a cantilever (22); a frame (23) which is provided around the cantilever (22) and holds a base end of the cantilever (22); a gap (24) formed between the cantilever (22) and the frame (23); and a liquid (28) which seals the gap (24).

16 Claims, 36 Drawing Sheets

(51) Int. Cl.
  *H04R 1/44* (2006.01)
  *H04R 7/20* (2006.01)
  *H04R 17/00* (2006.01)
  *B81B 3/00* (2006.01)
  *G01L 19/00* (2006.01)
  *H04R 1/42* (2006.01)
  *G01V 1/18* (2006.01)
  *H04R 1/38* (2006.01)

(52) U.S. Cl.
  CPC .......... *G01L 19/0046* (2013.01); *G01V 1/186* (2013.01); *H04R 1/42* (2013.01); *H04R 7/20* (2013.01); *H04R 17/00* (2013.01); *B81B 2203/0118* (2013.01); *H04R 1/38* (2013.01); *H04R 1/44* (2013.01); *H04R 2201/003* (2013.01); *H04R 2217/01* (2013.01)

(58) Field of Classification Search
  CPC ....... G01L 19/00; G01L 19/04; G01L 19/046; G01L 19/14; H04R 1/00; H04R 1/38; H04R 1/42; H04R 1/44; H04R 7/20; H04R 17/00; H04R 2201/003; H04R 2217/01; B81B 3/00; B81B 3/0027; B81B 2203/0118; G01V 1/186
  See application file for complete search history.

(56) References Cited

FOREIGN PATENT DOCUMENTS

| | | |
|---|---|---|
| JP | 2012150074 A | 8/2012 |
| WO | 2012/102073 A1 | 8/2012 |

OTHER PUBLICATIONS

Nguyen, Ming-Dung et al., A Sensitive Liquid-Cantilever Diaphraghm for Pressure Sensor, MEMS 2013, Jan. 20-24, 2013, pp. 617-620.

* cited by examiner

| gap size | HIVAC F-5* | HIVAC F-4* | water |
|---|---|---|---|
| 1 μm | No leak | No leak | No leak |
| 3 μm | No leak | No leak | No leak |
| 5 μm | Leak | No leak | No leak |
| 10 μm | Leak | Leak | No leak |

*HIVAC F-5, HIVAC F-4 were silicone fluidic oils
(Shin-Etsu Chemical Co.Ltd, Japan).

PRESSURE-SENSITIVE SENSOR

TECHNICAL FIELD

The present invention relates to a pressure-sensitive sensor, and particularly relates to a pressure-sensitive sensor which detects a pressure by using a cantilever.

BACKGROUND ART

It is possible to form a structure having a fine structure on a substrate formed of silicon or the like, by using a fine processing technology which is used in a process of forming a semiconductor integrated circuit, and the technology is expected to be developed in future. Such a structure is referred to as MEMS (Micro Electro Mechanical System(s)). Various sensors and actuators have been proposed as the MEMS until now.

Patent Literature 1 discloses a pressure sensor having a cantilever. The cantilever is a bending member having a fixed end and a free end, and is also referred to as a cantilever beam. In the pressure sensor, an air chamber is provided in a lower side of the cantilever, and an upper side of the cantilever is the outside (atmosphere). The cantilever is manufactured so as to exert a piezoresistive effect. A gap (clearance) is formed around the cantilever, and the air chamber is connected to the outside through the gap. Specifically, the air can flow between the air chamber and the outside through the gap. When a pressure difference appears between the upper side and the lower side of the cantilever, the cantilever is deformed, and the deformation is detected as a change of a piezoresistance value. The pressure difference is solved by a movement of the air through the gap, and finally a pressure balance state appears. This structure disclosed in Patent Literature 1 can obtain sensitivity higher than a diaphragm type sensor.

In FIG. 15 in Patent Literature 2, a biosensor having a cantilever is disclosed. An air chamber is provided in a lower side of the cantilever, and a micro flow channel which accommodates a liquid therein is formed in an upper side of the cantilever. A slit which is clearance is formed around the cantilever. An interface between the liquid and the gas is formed in the inside of the slit. Specifically, a surface tension of the liquid, and/or the like prevent the liquid from entering the gas chamber. When a specific substance existing in the micro flow channel becomes attached to the surface of the cantilever, a resonance frequency of the cantilever changes. The change of the resonance frequency is measured with a laser Doppler meter. Incidentally, in the structure disclosed in FIG. 1 in Patent Literature 2, there exists an open space (air layer) in the lower side of the cantilever.

CITATION LIST

Patent Literature

Patent Literature 1: International publication No. WO 2012/102073 (FIG. 1)
Patent Literature 2: Japanese Patent Laid-Open No. 2012-150074 (FIG. 1 and FIG. 15)

SUMMARY OF INVENTION

Technical Problem

A sensor is required which can detect information on a pressure, a sound pressure, acceleration, gas and the like, with higher sensitivity.

Then, an object of the present invention is to provide a pressure-sensitive sensor which can detect information on the pressure, the sound pressure, the acceleration, the gas and the like, with high sensitivity.

Solution to Problem

The pressure-sensitive sensor according to the present invention includes: a cantilever; a frame which is provided around the cantilever and holds the base end of the cantilever; a gap formed between the cantilever and the frame; and a liquid which seals the gap.

In addition, in the pressure-sensitive sensor, a gas chamber connected to the gap may be provided in the rear face side of the cantilever.

A concept of a force which is exerted from the outside and is detected by the pressure-sensitive sensor includes an outside pressure such as an atmospheric pressure, a water pressure and a sound pressure. Specifically, the pressure-sensitive sensor detects a force exerted from the outside, and the force includes vibration and acceleration. According to the above described structure, the cantilever (movable member having fixed end and free end) is provided so as to cover the gas chamber, and the gap formed around the cantilever (specifically between cantilever and frame) is sealed by the liquid. Thereby, the gas chamber is hermetically closed. The outside pressure is exerted on the cantilever indirectly through the liquid, or directly not through the liquid. Thereby, the cantilever is deformed. For instance, the leading end of the cantilever causes bending movement toward the gas chamber side (or toward reverse side). The deformation which has occurred in the cantilever is detected by a detecting device. The deformation may be microscopic. Even such a small amount of deformation, if a stress is generated in the cantilever, the deformation is sufficient. In the case where a piezo resistance detection system is adopted, for instance, if the stress is generated in the cantilever due to the outside pressure, the piezoresistance value in the cantilever changes, and the change of the resistance value is detected. It is desirable to configure the gas chamber as a closed space except for the gap, but it is also acceptable to connect a pressure setting mechanism to the gas chamber, and variably set the pressure in the gas chamber, i.e. a reference pressure. In such a configuration as well, at least when the pressure is detected, a valve on the pipe which is connected to the gas chamber is closed, and a hermetically-closed state of the gas chamber is formed.

Preferably, an interface between the liquid and the gas remains in the inside or the vicinity of the gap, regardless of the deformation of the cantilever, and thereby the hermetically-closed state is maintained. In other words, the outside pressure is detected as the deformation of the cantilever, under conditions that the gas is prevented from flowing out (gas leak) from the gas chamber and the liquid is prevented from flowing into (liquid leak) the gas chamber. The interface is normally formed in the inside of the gap, but is occasionally formed in the vicinity of the gap, which deviates from the inside of the gap, according to the size of the pressure difference, the properties of the liquid, the degree of the deformation of the cantilever, and the like. The interface shows various shapes, and the interface forms typically a concave surface, a convex surface or a flat surface. The gap size is selected so as to satisfy the condition that the leak does not occur regardless of the movement of the cantilever.

When the cantilever having the free end is used as the pressure-sensitive member, a large deformation in general can be caused in the pressure-sensitive member as compared to a diaphragm which is also the pressure-sensitive member and has both ends fixed (or peripheral edge fixed), and the detection sensitivity is enhanced. In the above described structure, only gas basically exists in the lower side of such a cantilever, and accordingly a load or a reactive force to be exerted on the cantilever can be reduced, as compared to the case where the liquid exists in the lower side thereof. Thereby, the sensitivity and the responsibility are enhanced. Besides, in the above described structure, the gap is sealed by the liquid, and accordingly the outside pressure can be detected as an absolute pressure with reference to the internal pressure of the gas chamber.

Various types of gas can be used as the gas accommodated in the gas chamber. It is desirable to use gas which is chemically stable and is excellent in handleability. Various substances also can be used as the liquid. However, it is desirable to use a liquid which can sufficiently maintain the interface regardless of the movement of the cantilever, and does not exert a large load onto the cantilever when the cantilever moves. The concept of the liquid includes a liquid material (gel, for instance). In the case where the liquid is attached to the upper face of the sensor unit in a form of a droplet (in the case where liquid is exposed), it is desirable to use a substance which has a low vapor pressure and is chemically stable, as the liquid. It is also acceptable to sink the sensor unit having the lower side structure and the upper side structure in a liquid, and detect the pressure in the liquid. In this case, the liquid seals the gap simultaneously when the sensor unit has been arranged in the liquid.

Preferably, the pressure-sensitive sensor includes: a sensor unit which has the lower side structure and the upper side structure; and a detecting circuit which processes a signal sent from the sensor unit, wherein the cantilever includes a detecting layer of which the electrical characteristics vary due to the deformation of the cantilever, and the detecting circuit detects the change of the electrical characteristics of the detecting layer.

According to the above described structure, the detecting layer is added to or incorporated in the cantilever, and the deformation of the cantilever is detected as a change of the electrical characteristics (resistance, voltage or the like) of the detecting layer. Thereby, a signal showing the degree of the deformation is output from the sensor unit itself. It is desirable that the detecting layer is structured as a piezoresistive layer, but may be structured as a piezoelectric layer. Other devices for detecting the deformation of the cantilever includes an optical measurement device and a capacitance detecting device. It is also acceptable to form not only a sensor unit but also a detecting circuit on a semiconductor substrate. It is possible to use an MEMS technology when manufacturing the pressure-sensitive sensor. If such a technology is used, it is easy to simultaneously manufacture a large number of sensors, and it is possible to reduce the manufacturing cost.

Preferably, the liquid covers the cantilever and the gap, and the outside pressure is transmitted to the cantilever through the liquid. According to this structure, not only the gap but also the whole cantilever is covered with the liquid, and the liquid functions as a gap sealing member and a pressure transmitting medium member. Any method can be adopted out of a method of introducing a fixed amount of liquid onto the upper face of the sensor unit, and a method of sinking the sensor unit into the liquid.

Preferably, a liquid retaining region which includes the upper face of the cantilever and the upper face of the gap, and a liquid expelling region which is provided around the liquid retaining region are provided on the upper face of the upper side structure; and the liquid comes in contact with the liquid retaining region. This structure can confine the liquid within a limited range (while preventing liquid from flowing out), and besides, can make the liquid function. It is desirable to subject the liquid expelling region to a treatment for enhancing liquid expelling properties (when aqueous liquid is used, hydrophobic treatment, for instance). It is also possible to subject the liquid retaining region to a treatment for enhancing liquid retaining properties (when aqueous liquid is used, hydrophilic treatment, for instance). It is also acceptable to provide a partition wall or the like between the two regions.

Preferably, a film having flexibility is provided so as to cover the liquid, and the outside pressure is transmitted to the liquid through the film. This structure can prevent the outflow and deterioration of the liquid. This structure can also provide such an advantage that a degree of flexibility is enhanced in the selection of the liquid. It is desirable to use a substance having adequate pressure transferability as the film. In the case where the film is directly formed on the liquid, it is desirable to use a liquid compatible with the manufacturing method. A sensor unit in which the liquid is confined by the film may be arranged in the liquid. In this case, the pressure is transmitted from the external liquid to the film, from the film to the internal liquid, and further from the internal liquid to the cantilever.

Preferably, the liquid is provided locally on the gap, and the outside pressure is transmitted directly to the cantilever. This structure can reduce the amount of the liquid, accordingly can considerably reduce a load exerted on the cantilever by the liquid. In addition, the structure can transmit the outside pressure directly to the cantilever, and accordingly can more enhance the sensitivity and the responsibility.

Preferably, the sensor unit having the lower side structure and the upper side structure is arranged in a liquid tank, and the sensor unit detects a pressure which travels in the liquid in the inside of the liquid tank. According to this structure, the liquid in the inside of the liquid tank shows a sealing action in addition to a pressure transmitting action. However, it is also possible to provide a liquid for the sensor unit separately from the liquid in the inside of the liquid tank. In this case, it is desirable to provide a separating film which separates the two liquids from each other.

Preferably, the sensor unit is a hydrophone which detects a sound wave that travels in the liquid. The hydrophone is also a sensor which detects a pressure (sound pressure), in other words, is one mode of the pressure-sensitive sensor.

Preferably, the hydrophone has a sound guide which guides the sound wave to the cantilever. The sound guide can enhance the sensitivity by its sound-collecting action. In addition, if directivity is given to the hydrophone, a sound to be observed can be adequately selected. It is also acceptable to arrange a sound absorbing material in addition to the sound guide, which attenuates an unnecessary wave sent from other directions than an orientation direction.

Preferably, in the pressure-sensitive sensor, a temperature compensation system for compensating the temperature characteristics of the cantilever is provided. If the temperature is compensated, the pressure can be accurately detected at various temperatures. It is also possible to use an electrical compensation system, but it is also acceptable to compensate the temperature by data processing on the basis of the detected temperature.

Preferably, the temperature compensation system has a non-deforming type dummy cantilever that has characteristics similar to resistance variation characteristics with respect to the temperature, which the cantilever has. This structure can compensate resistance variation characteristics with respect to the temperature, which the cantilever originally has, by using resistance variation characteristics with respect to the temperature, which the dummy cantilever has; and can compensate the temperature with high accuracy, with a simple structure.

Preferably, the temperature compensation system has an element which is provided on the cantilever or in the vicinity thereof and outputs a signal in response to the temperature. Such an element is, for instance, a temperature sensor, an element having similar electrical characteristics to those of the cantilever, or the like.

Preferably, the pressure-sensitive sensor includes a protection mechanism which limits deformation of the cantilever within a fixed range and thereby protects the cantilever. The protection mechanism can employ a mechanism which prevents the outside pressure from being exerted on the cantilever when the outside pressure becomes a fixed value or more, a mechanism which stops the movement of the cantilever when the cantilever is bent to exceed a fixed range, and the like. Such a protection mechanism can protect the cantilever, and accordingly can avoid a failure and a damage of the cantilever.

Preferably, the pressure-sensitive sensor includes an array formed of a plurality of sensor units which are arrayed one-dimensionally or two-dimensionally. Each of the sensor units has the lower side structure and the upper side structure, and in each of the sensor units, a hermetically-closed state is formed in which the gas is confined in the gas chamber by the liquid that seals the gap. According to this structure, a pressure, a pressure distribution and the like are detected by the plurality of sensor units. A single cavity may be used in common for the plurality of sensor units.

A method of using the pressure-sensitive sensor according to the present invention is a method of using the pressure-sensitive sensor which includes the lower side structure and the upper side structure, and the method includes: a step of sealing the gap by a liquid to form a hermetically-closed state in which the gas is confined in the gas chamber, wherein an interface between the liquid and the gas stays inside or in a vicinity of the gap regardless of the deformation of the cantilever, and thereby the hermetically-closed state is maintained; and a step of detecting the deformation of the cantilever, which occurs due to the outside pressure, in the hermetically-closed state, as a change of the electrical characteristics that the cantilever has.

Advantageous Effects of Invention

The pressure-sensitive sensor according to the present invention detects a force exerted from the outside, by the cantilever through the liquid, and thereby can measure information on a pressure, a sound pressure, acceleration, gas and the like, with high sensitivity, as compared to conventional pressure sensors.

DESCRIPTION OF EMBODIMENTS

Preferred embodiments of the present invention will be described below with reference to the drawings.

1. First Embodiment (1) Basic Structure of Pressure Sensor

Figure 1:
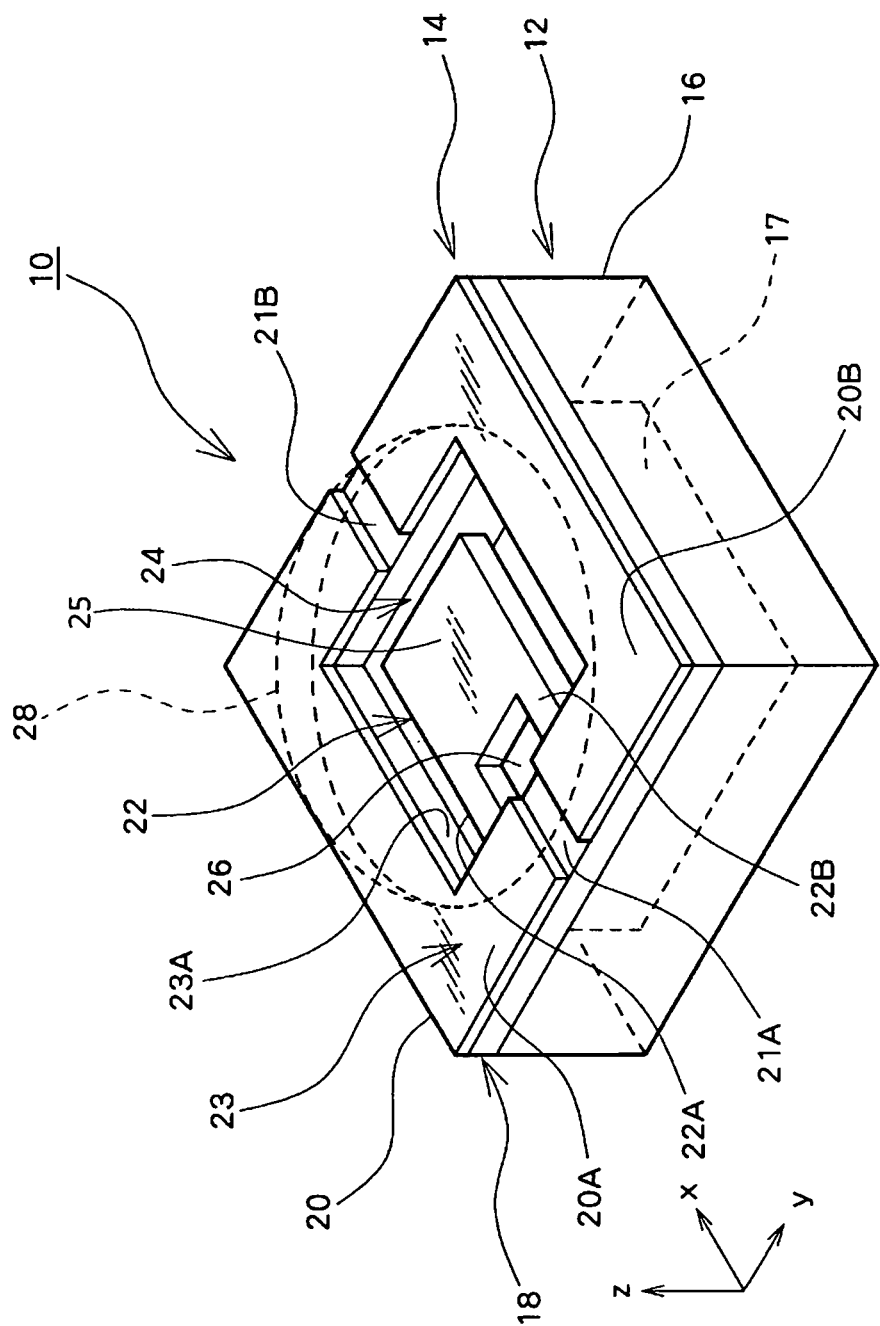
FIG. 1 is a perspective view showing a pressure sensor according to a first embodiment of the present invention.

A pressure sensor 10 which works as a pressure-sensitive sensor shown in FIG. 1 has a lower side structure 12 and an upper side structure 14. The pressure sensor is used for detecting an outside pressure such as an atmospheric pressure, a water pressure, a sound pressure and a stress, which are forces exerted from the outside; and more specifically is a sensor for measuring a physical quantity such as a force, vibration and acceleration. The pressure sensor can be used in various industrial fields such as general measurement, industrial manufacture, an automobile and a medical treatment. In the present specification, a "lower side" and an "upper side" are only relative concepts for describing each member.

The lower side structure 12 has a container 16 having an air cavity 17. The container 16 is formed from a material having airtightness, for instance, such as a resin, a semiconductor and other materials. The air cavity 17 is a gas chamber, and an inside thereof is filled with the air (atmosphere), as will be described later in detail. The air cavity 17 has a recessed shape or a cube shape of which the upper part is opened. The pressure sensor 10 is connected to a detecting circuit which will be described below.

The upper side structure 14 is integrated with the lower side structure 12. The upper side structure 14 has a cantilever 22 which works as a movable portion, and a frame 23 which surrounds the cantilever 22 in a horizontal direction. The cantilever 22 is a member which has a free end and a fixed end, extends in a horizontal direction so as to cover the air cavity 17, and is elastically deformed. The base end (fixed end) side of the cantilever 22 is held by the frame 23. The leading end (free end) of the cantilever 22 constitutes an end which can freely move. The cantilever 22 has two legs 22A and 22B, and the legs are connected to the frame 23. The two legs 22A and 22B form a bifurcated form, and a rectangular hole 26 is formed between the two legs, which penetrates in a vertical direction. A portion other than the two legs 22A and 22B in the cantilever 22 constitutes a main body 25 of the cantilever. The main body 25 of the cantilever is a planar portion which receives a pressure exerted from the outside. In the illustrated example, the cantilever 22 has a fixed thickness over the whole. When a horizontal direction which connects the fixed end and the free end in the cantilever 22 is defined as an x direction, another horizontal direction perpendicular to the x direction is defined as a y direction, and a vertical direction is defined as a z direction, a bending direction of the cantilever 22 becomes the z direction. The cantilever 22 is a thin sheet spreading in the x direction and the y direction.

The upper side structure 14 has a stacked structure, and specially is formed of a stacked substrate 18 and an electrode layer 20. The structure of the stacked substrate 18 will be described later, but the stacked substrate 18 includes a silicon layer which is a lower layer, and a piezoresistive layer (doped layer) which is an upper layer. The cantilever 22 and the frame 23 are each structured as a part of the stacked substrate 18. Specifically, the cantilever 22 is formed of the silicon layer and the piezoresistive layer. An electrode layer 20 is provided on the frame 23 in the stacked substrate 18. The electrode layer 20 is a layer for electrical connection with the two legs 22A and 22B which the cantilever 22 has. The electrode layer 20 is formed of a first electrode 20A and a second electrode 20B. Grooves 21A and 21B which work each as an insulating zone are each provided between both of the electrodes. The piezoresistive layer may be divided by the grooves 21A and 21B in the frame 23.

The frame 23 has a rectangular form when viewed from above, and an inside thereof is an opening 23A having a rectangular form. In the inside of the opening 23A, the cantilever 22 is elastically deformed according to a pressure transmitted from the outside. Specifically, the cantilever performs the bending movement of moving its leading end in the z direction. A gap 24 is formed between the frame 23 and the cantilever 22, more specifically, between the inside face of the frame 23 and the outside face of the cantilever 22. The gap 24 has such a form as a U shape which has two right-angled corners, when viewed from above. The width (breadth) of the gap 24 in each position is equal. It is also possible to form the corner portion of the gap 24 into a round shape. Incidentally, in FIG. 1, the gap 24 is drawn so as to be exaggeratedly large.

As is shown in FIG. 1, a liquid 28 having a dome-shaped form is provided on the upper face of the upper side structure 14. The liquid 28 is provided mainly so as to seal the gap 24, and in the structure example shown in FIG. 1, further exerts also a transmission action of the outside pressure. When the liquid 28 is introduced, an interface (bridge) between the liquid and the air is formed in the inside or the vicinity of the gap 24. On the precondition that the gap 24 is a narrow interstice, the interface is formed by a surface tension of the liquid, viscosity of the liquid, an internal gas pressure and the like, and is maintained. Even though the change of the shape of the interface and the movement of the interface have occurred due to the movement of the cantilever 22, the interface itself is maintained. In other words, the sealed state of the gap 24 (hermetically-closed state of air cavity 17) is maintained. It is considered that the interface exerts a force of returning the cantilever 22 on the deformed cantilever 22, depending on the properties of the liquid. In order to enhance the liquid retaining properties or operate the formation of the interface in the pressure sensor 10, a necessary portion on the surface of the cantilever 22, the inner face of the frame 23 and the inner face of the air cavity 17 may be subjected to a surface treatment for expelling the liquid.

As has been described above, the liquid 28 is a substance for sealing the gap 24, and accordingly it is desirable to select a substance which has a large surface tension, has a certain degree of viscosity and is chemically stable, as the liquid 28. Furthermore, in the case where the liquid 28 is not enclosed but is provided to be exposed, it is desirable to select a liquid which has a low vapor pressure and shows adequate handleability. It is desirable to select the liquid to be used in consideration of various conditions required for the liquid. Examples of the liquid 28 can include water, silicone fluidic oil, an ionic liquid and the like. It is also possible to use a liquid material like a gel. When the water is used, in order to prevent the evaporation and the outflow, it is desirable to separately provide a film which encloses the water. Such encapsulation will be described later with reference to FIG. 17.

In the present embodiment, the air is accommodated in the air cavity 17, but another gas may be accommodated therein. It is desirable that another gas is chemically stable and has properties which are not changed by the liquid 28, and an inert gas such as nitrogen, for instance, can be used. In the present embodiment, the air cavity 17 is structured as an enclosed space except for the gap 24. Specifically, when the gap 24 is sealed by the liquid 28, the air cavity 17 becomes a hermetically-closed space. The lower side structure 12 and the upper side structure 14 come completely in close contact with each other, and do not cause the air leak and the liquid leak in between both of the structures.

A pressure variable device (unillustrated) may be connected to the air cavity 17 through a pipe. Such a structure can change the pressure (reference pressure) of the air cavity 17. Even in such a structure, when the pressure is measured, a valve provided on the pipe, for instance, becomes a closed state, and thereby a hermetically-closed state of the air cavity 17 is formed.

It is desirable to set the size (breadth) of the gap 24 in consideration of various conditions such as properties of the liquid to be used, a quantity of the liquid to be used, a shape of the gap and properties of the inner face of the frame 23. In any case, it is desirable to form the gap 24 into a sufficiently small size so that the liquid leak and the gas leak do not occur through the gap 24. According to a result of the experiment which will be described later, the gap size is set to be more than 0 μm and 10 μm or less, and preferably is set at 5 μm or less, and further preferably is set at 3 μm or less, depending on the liquid to be used. However, it is considered that if the liquid having a high sealing action is used, the size can be set on the order of mm. Of course, a gap size on the order of nm may also be possible.

In the structure example shown in FIG. 1, the cantilever 22 includes a piezoresistive layer which is a doped layer, and the deformation of the cantilever 22 is detected as a change of the piezoresistance value. In order to increase the amount of the change of the piezoresistance value, two thin legs 22A and 22B are provided in the cantilever 22, and the rectangular hole 26 which works as an insulating area is formed between the two legs. Accordingly, values of piezoresistance are measured along a U-shaped path from one leg 22A through the main body 25 of the cantilever to the other leg 22B. A system which uses piezoelectric characteristics may be adopted in place of the piezoresistive system. Alternatively, it is also possible to adopt a laser displacement measurement system, a capacitance measurement system and the like. However, if the piezoresistive system is adopted, the deformation of the cantilever can be directly and easily detected. In addition, the cantilever can be easily manufactured.

The weights of the cantilever 22 and the liquid 28 are extremely small, and the gravity which is exerted on the cantilever 22 and the liquid 28 can be almost neglected. In other words, the pressure sensor can be used in a form of being directed toward various directions, for instance, in a form of being directed downward. However, in the case where the pressure-sensitive sensor is structured as an acceleration sensor, the cantilever results in being made to function as a weight.

Figure 2:
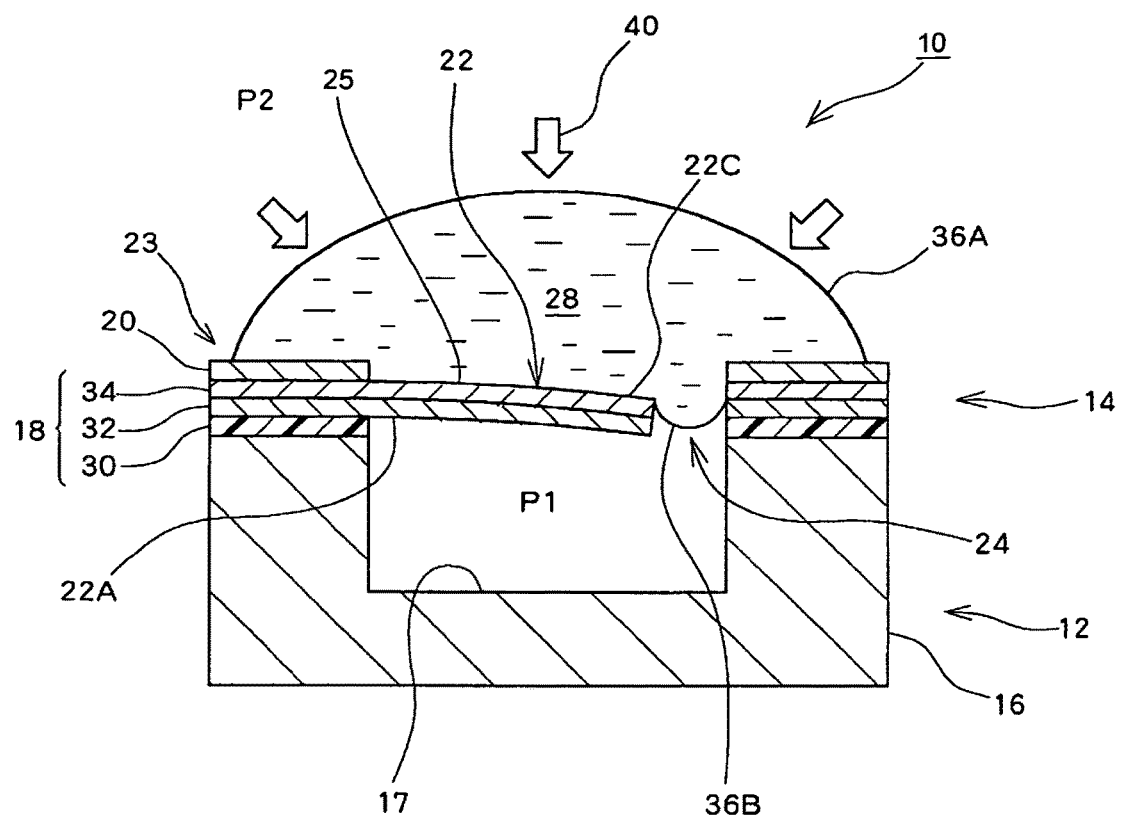
FIG. 2 is a sectional view of the pressure sensor shown in FIG. 1.

FIG. 2 shows a longitudinal sectional view of the pressure sensor shown in FIG. 1. As has been described above, the pressure sensor is roughly divided into the lower side structure 12 and the upper side structure 14. The lower side structure 12 has the container 16 having the air cavity 17 therein. A part or the whole of the container 16 may also be formed of the silicon substrate. A part or the whole of the container 16 may also be formed of a resin (PDMS or the like). The upper side structure 14 has the stacked substrate 18 and the electrode layer 20. In FIG. 2, the stacked substrate 18 has an insulating layer ($SiO_2$ layer) 30, a silicon layer (Si layer which is undoped layer) 32, and a resistive layer (n-type layer) 34 that is a doped layer, which are provided from the lower side to the upper side. The resistive layer 34 is the piezoresistive layer. Specifically, the layer is a thin film layer of which the resistance value varies depending on a stress. The resistive layer 34 may be formed to be a p-type layer. The cantilever 22 is formed of the silicon layer 32 and the resistive layer 34.

In the illustrated structure example, the frame 23 is also formed of the silicon layer 32 and the resistive layer 34. However, the resistive layer does not need to be formed in the frame 23, and even though the resistive layer is formed, the resistive layer does not function. In the illustrated structure example, the cantilever 22 is integrated with the frame 23 at the base end of the cantilever 22, and accordingly the strength of the cantilever 22 can be easily ensured. In place of the above described structure, the frame 23 may be formed only of a silicon substrate having no impurity. The electrode layer 20 provided on the stacked substrate 18 is formed of, specifically, a Cr layer which works as an underlayer, and an Au layer which works as an electroconductive layer. It is desirable that the resistive layer may be subjected to a grooving work or other measures so that a positive electrode and a negative electrode are not short-circuited through the resistive layer 34 in the frame 23.

When a system of exposing the liquid 28 is adopted, a liquid surface 36A becomes a form of being fixed by the surface tension. When the liquid 28 is placed on the upper face of the upper side structure 14, the gap 24 is sealed by the liquid 28. Specifically, in the illustrated example, an interface (bridge) 36B is formed in the gap 24, and both of the leak of the liquid 28 and the leak of the air are prevented. The interface 36B is formed due to the properties of the liquid, particularly, due to the surface tension or the viscosity. It is considered that a reaction force and the like from the side of the air cavity 17 are also exerted on the interface 36B. FIG. 2 shows a first example of the interface 36B (other examples will be described later with reference to FIG. 18 to FIG. 20). It is considered that a form of the interface 36B and a position at which the interface 36B is formed depend on the properties of the liquid, the amount of the liquid, the gap size, the shape of the gap, the properties of the inner face of the frame, and the like.

The outside pressure (external pressure) (P2 in FIG. 2) is exerted on the upper face of the cantilever 22 through the liquid 28, as is denoted by reference numeral 40. Thereby, the cantilever 22 is elastically deformed, as is shown in FIG. 2. The air pressure (internal pressure) in the air cavity 17 at this time is shown by P1 in FIG. 2. When a force exerted on the surface of the cantilever 22 by the outside pressure P2 is balanced with the internal pressure P1 and a reaction force such as a restoring force of the cantilever 22, the deformation of the cantilever 22 stops, and the state is maintained. Even though an interface 36B has moved at the time of the movement of the cantilever 22, the interface 36B itself is maintained. Correctly, the liquid is selected and the size of the gap 24 and the like are selected so that the interface 36B is maintained. In other words, the sealed state at the gap 24 is maintained regardless of the deformation and the movement of the cantilever 22. In other words, various conditions are determined so that the liquid leak and the gas leak through the gap 24 do not occur. Incidentally, a device for detecting such leaks may be added. For instance, it is also acceptable to form an element of which the resistance value changes due to contact with the liquid in the inner face of the air cavity 17, and determine the liquid leak, in other words, the collapse of the hermetically-closed state, on the basis of the change of the resistance value of the element.

The above described structure can detect the outside pressure P2 with reference to the internal pressure P1 of the hermetically-closed air cavity 17. In other words, the structure of the present embodiment can detect not a change of the pressure, in other words, not a relative pressure, but an absolute pressure.

The pressure sensor 10 detects the outside pressure P2 by the cantilever 22 through the liquid 28, and thereby can measure a physical quantity such as a force, vibration and acceleration with high sensitivity, as compared to a conventional pressure sensor. Generally, the cantilever system can enhance detection sensitivity as compared to the diaphragm system, but the air results in flowing through the gap around the cantilever, and accordingly can detect only the change of the pressure, in other words, the relative pressure. In contrast to this, in the above described structure, the gap 24 can be sealed by the liquid 28, and accordingly the absolute pressure can be detected. In this case, a sealing is made by a liquid having flowability, and accordingly a load to be exerted on the cantilever 22 is very small. Besides, basically only air exists in the lower side of the cantilever 22, and accordingly a reactive force to be generated against the cantilever 22 at the time of the movement of the cantilever 22 can be made very small. Accordingly, the structure of the present embodiment can achieve a pressure sensor which can detect an absolute pressure with high sensitivity though being a simple structure.

Figure 3:
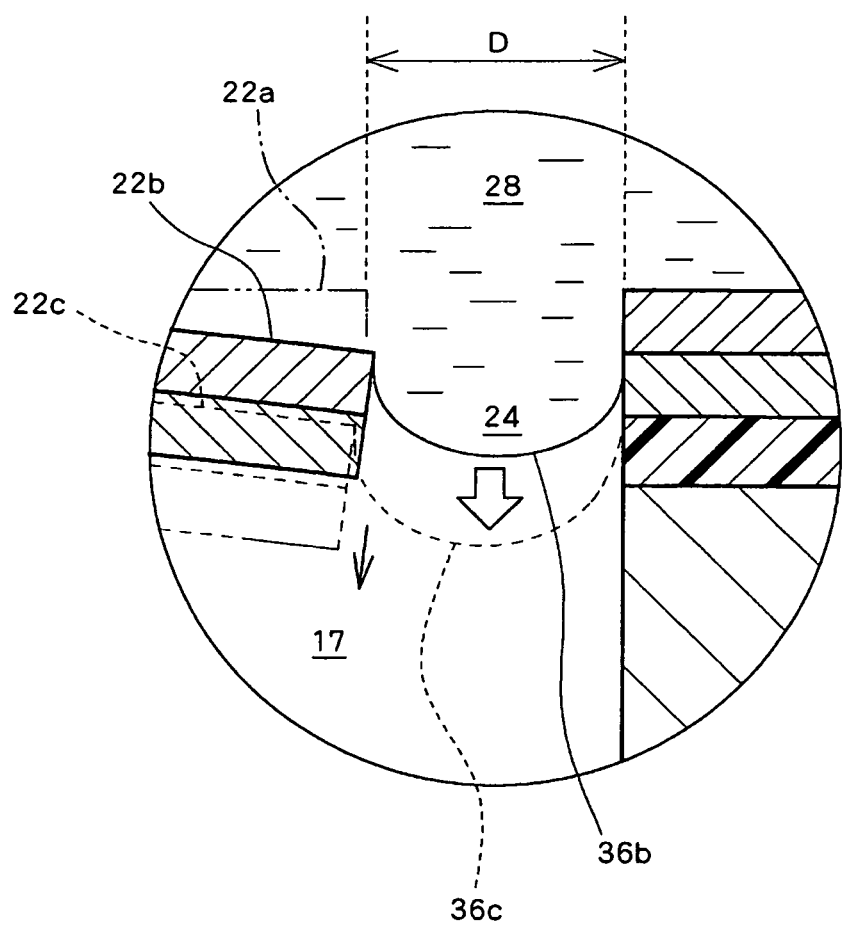
FIG. 3 is an enlarged view showing a part in the sectional view of FIG. 2.

FIG. 3 is an enlarged view of the gap 24 shown in FIG. 2. The cantilever in an original attitude (horizontal attitude) is denoted by reference numeral 22a. Reference character D denotes a breadth of the gap 24, in other words, the gap size. Reference numeral 22b denotes the cantilever which has been deformed to a middle degree. Reference numeral 22c denotes the cantilever which has been largely deformed. Usually, a position of the interface changes due to the degree of the deformation (bent degree) of the cantilever (see reference numerals 36b and 36c). The interface itself is maintained even when the cantilever has moved, in other words, the liquid leak and the air leak do not occur. It is desirable to use a liquid having a high surface tension so that the interface is stably formed. It is also acceptable to subject the rear face of the cantilever, the inner face of the frame and the like to treatment for causing a liquid expelling action. Such a structure can reduce a possibility that the interface collapses.

Figure 4:
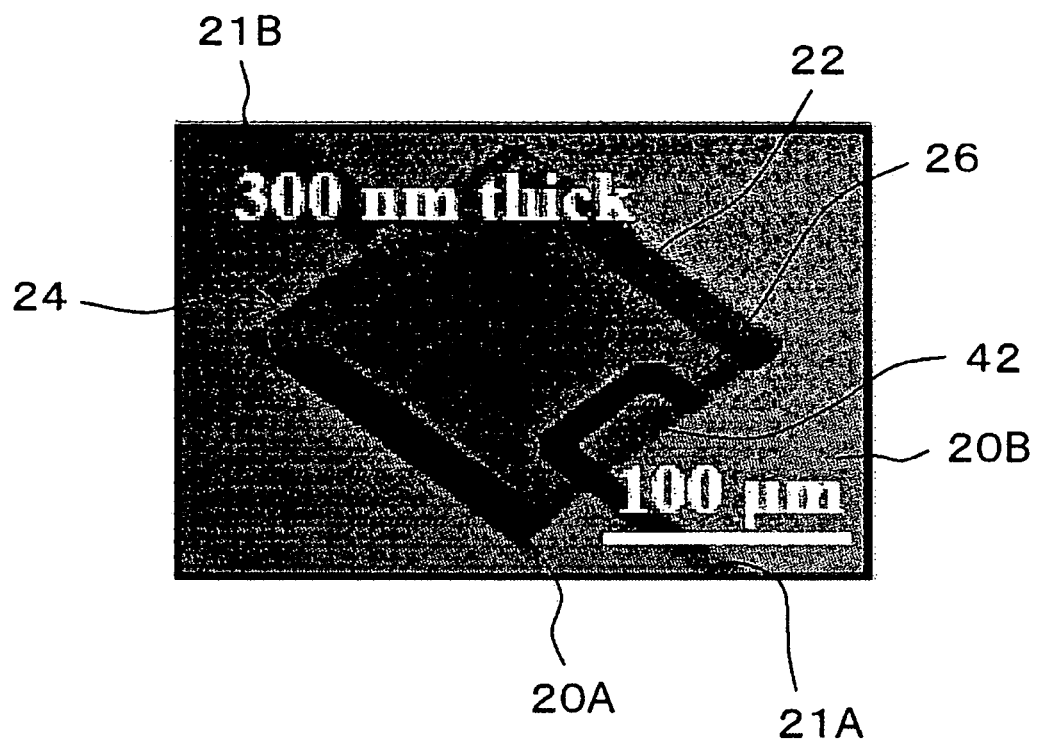
FIG. 4 is a view showing a cantilever which the pressure sensor shown in FIG. 1 has.

FIG. 4 is a view showing the cantilever 22 which has been actually manufactured. The cantilever 22 has, for instance, a thickness of 300 nm. The gap 24 is formed around the cantilever 22, and the hole 26 between a pair of the legs which the cantilever 22 has is partially covered with a cover 42. When the size of the hole 26 is large, a liquid leak and the like through the hole 26 are concerned, and accordingly the cover 42 which works as a lid is provided so that only a clearance having the gap size or less is formed there. The cover 42 is structured, for instance, of the same stacked body as the cantilever 22. A pair of the electrodes 20A and 20B are connected to a pair of the legs, respectively. Grooves 21A and 21B which work each as the insulating zone exist between the electrodes.

(2) Method of Manufacturing Pressure Sensor

Figure 5:
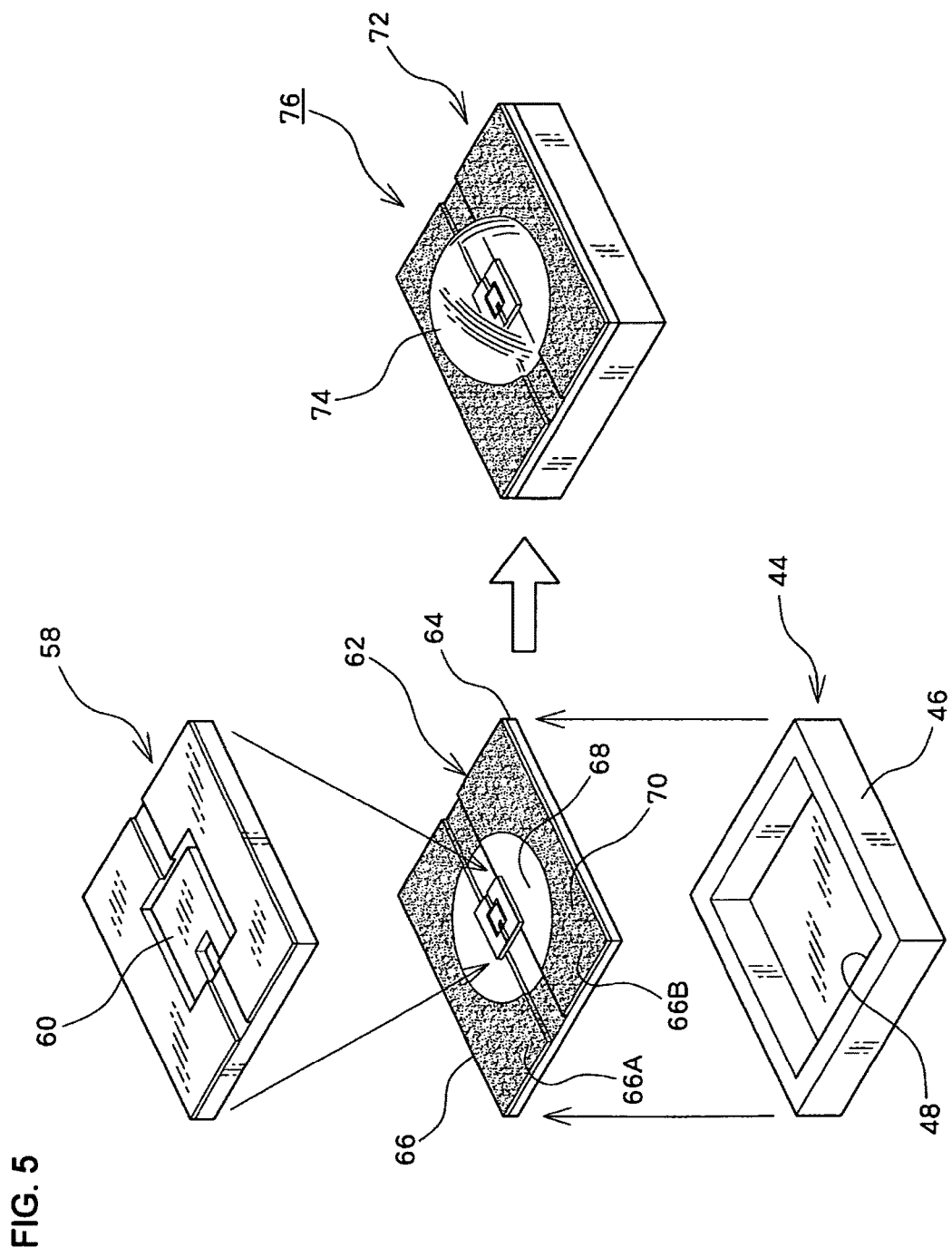
FIG. 5 is a view showing an assembly of the pressure sensor.

FIG. 5 schematically shows an assembly of the pressure sensor. A first portion 58 having a cantilever 60 is joined and fixed to a central part of a wiring substrate (base substrate) 62 which constitutes a second portion. A pair of electrodes 66A and 66B are formed on a wiring substrate 62. A liquid storing region 68 which is the central part and a liquid expelling region 70 which is the peripheral part are formed on the upper face of the wiring substrate 62. When the liquid is aqueous, the liquid storing region 68 is, for instance, a hydrophilic region, and the liquid expelling region 70 is, for instance, a hydrophobic region. The liquid expelling region 70 is a region which has been subjected to hydrophobic treatment. The liquid storing region 68 may be subjected to the hydrophilic treatment. A third portion which is a container 46 having an air cavity 48 is joined and fixed to the lower side of the wiring substrate 62. The first portion 58 constitutes the upper side structure, and the second portion (wiring substrate 62) and the third portion constitute the lower side structure. An assembly 72 is manufactured by joining the first portion to the third portion to one another, and a liquid 74 is provided on the upper face of the assembly 72. In this case, the liquid 74 results in staying in the liquid storing region. The pressure sensor 76 is structured according to the above description.

Figure 6:
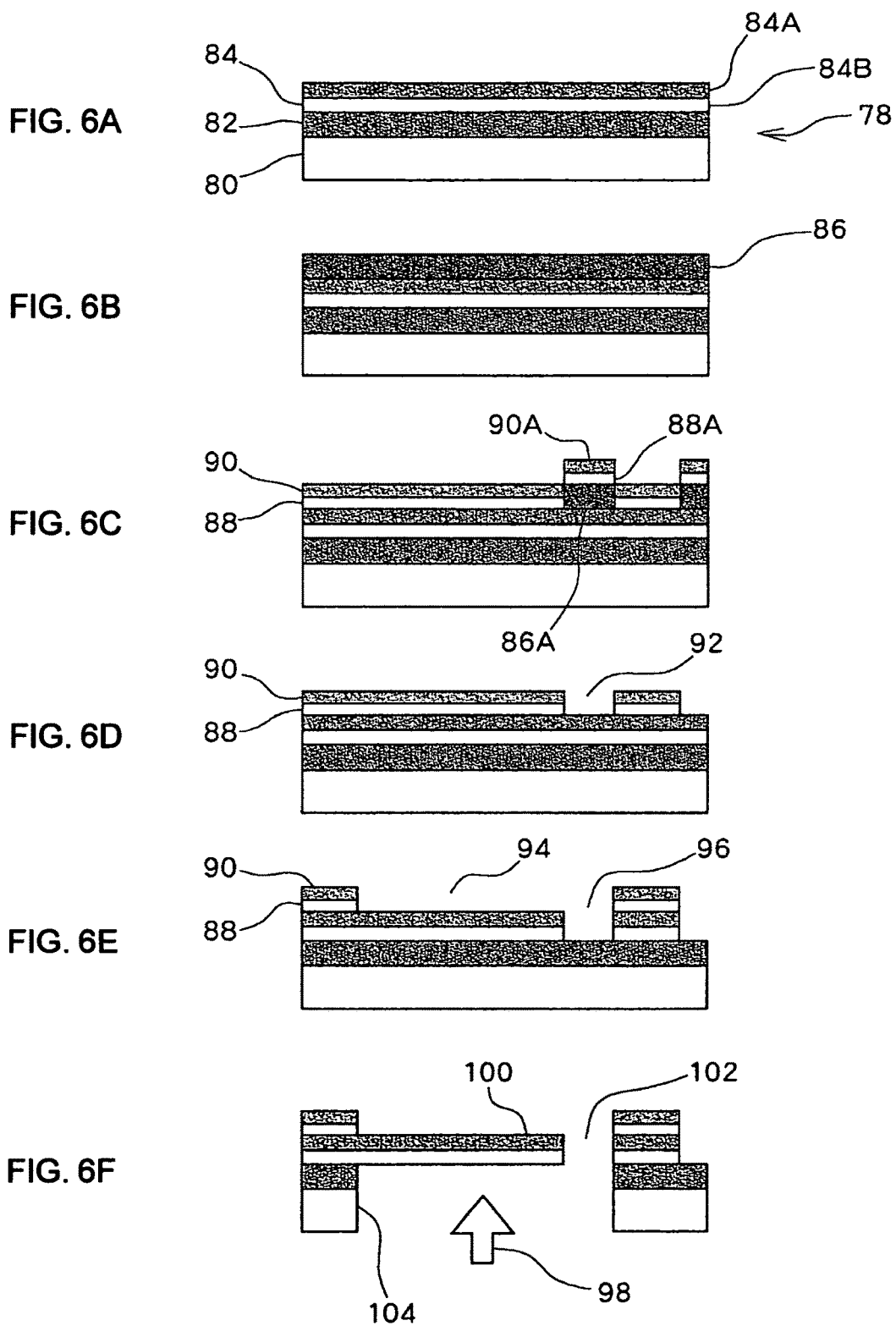
FIGS. 6A to 6F are views illustrating a process of manufacturing a cantilever structure.

FIGS. 6A to 6F show one example of a process of manufacturing the cantilever. As is shown in FIG. 6A, firstly, a substrate body 78 having an SOI structure is prepared. The substrate body 78 has an Si substrate 80, an insulating layer ($SiO_2$ layer) 82 and an Si layer 84. The Si layer 84 is doped with a doping material, and thereby a resistive layer 84A is formed. The resistivity of the surface layer on the Si layer 84 is lowered by doping, the migration of the electric charge results in being permitted, and the surface layer results in functioning as the resistive layer 84A. A portion other than the resistive layer 84A in the Si layer 84 becomes an Si layer 84B which works as an undoped layer. Next, as is shown in FIG. 6B, a resist layer 86 is formed on the upper side of the resistive layer 84A. After that, the resist layer is exposed to light with the use of an electron beam and the like, and then is subjected to etching treatment. Moreover, as is shown in the present FIG. 6C, a Cr layer 88 and an Au layer 90 are formed. At this time, the Cr layer 88A and the Au layer 90A deposit on the resist portion 86A which has remained after the etching. After that, as is shown in FIG. 6D, the layers are subjected to lift-off treatment and a groove 92 is formed. Furthermore, as is shown in FIG. 6E, the layers are etched from the upper side in a predetermined pattern; and a deep groove 96 is formed, and an electrode layer on the upper side of the cantilever is removed (see reference numeral 94). Next, in FIG. 6F, as is denoted by reference numeral 98, firstly, the Si substrate is subjected to reactive ion etching from the rear face side, and subsequently the insulating layer (SiO$_2$ layer) is removed with the use of HF. Thereby, a cantilever 100 and a gap 102 are completed. A wall 104 constitutes the container of the air cavity. As has been described above, the pressure sensor can be manufactured with an MEMS technology, and thereby a large number of pressure sensors can be simultaneously and inexpensively manufactured.

(3) Evaluation of Characteristics

Figure 7:
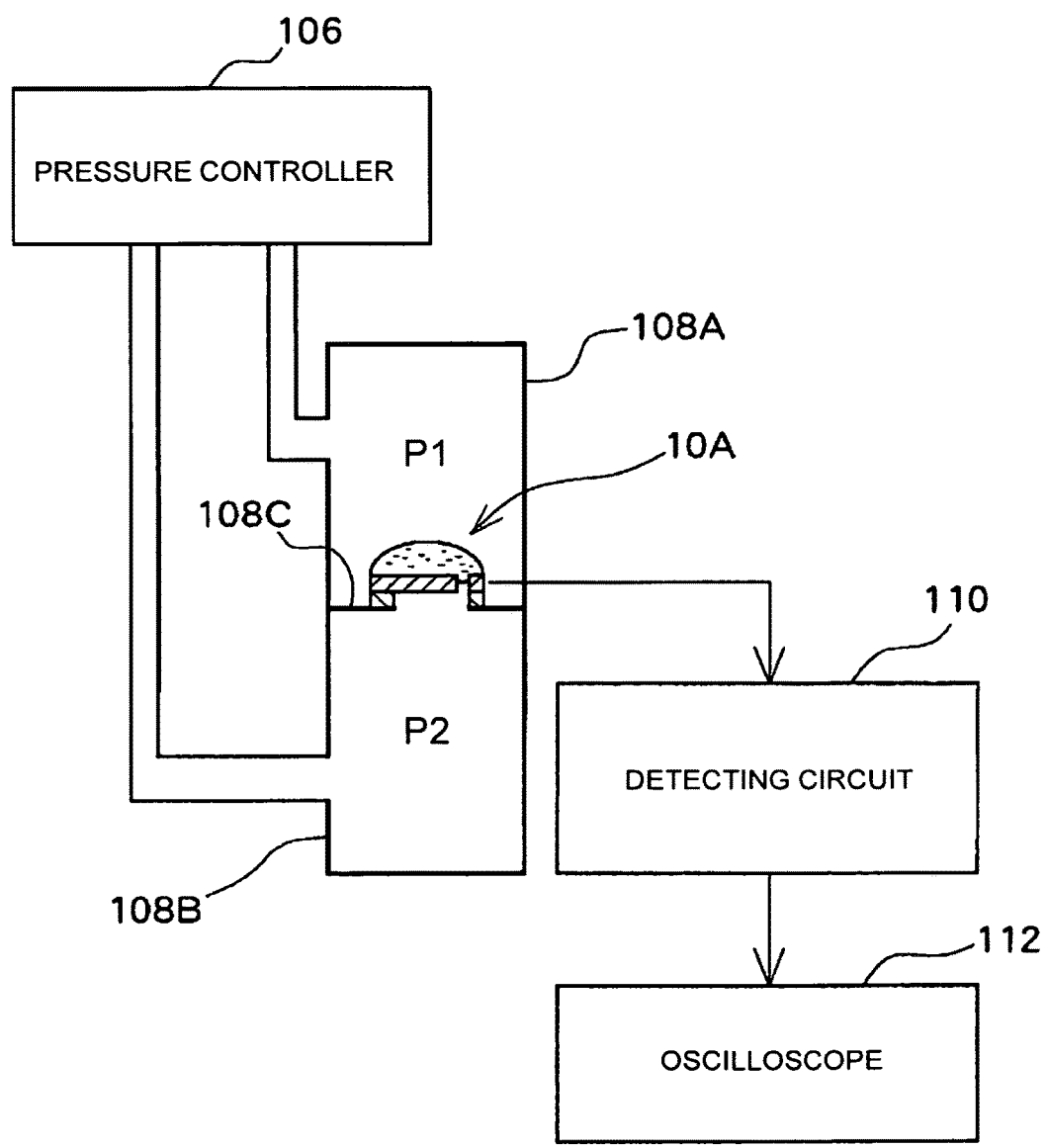
FIG. 7 is a schematic view showing an experimental system for testing a performance of the pressure sensor.

FIG. 7 shows an experimental system for testing the pressure sensor. The pressure sensor 10A which has been used as an experimental object is only the upper side structure that is taken out from the structure shown in FIG. 5, for instance, and does not have the air cavity which is the enclosed space. A pressure chamber 108A is provided on the upper side of the pressure sensor 10A, and a pressure chamber 108B is virtually provided in the lower side of the pressure sensor 10A. This pressure chamber 108B corresponds to the air cavity. In the experimental system shown in FIG. 7, a pressure controller 106 is connected to the pressure chambers 108A and 108B so as to independently control the internal pressures P1 and P2 of the pressure chamber 108A and the pressure chamber 108B, respectively. It is possible to freely set a pressure difference $\Delta P$ (=P1−P2) by the pressure controller 106. The pressure sensor 10A is connected to a detecting circuit 110, and an output signal of the detecting circuit 110 is input into an oscilloscope 112 in the example shown in FIG. 7.

Figures 8, 9:
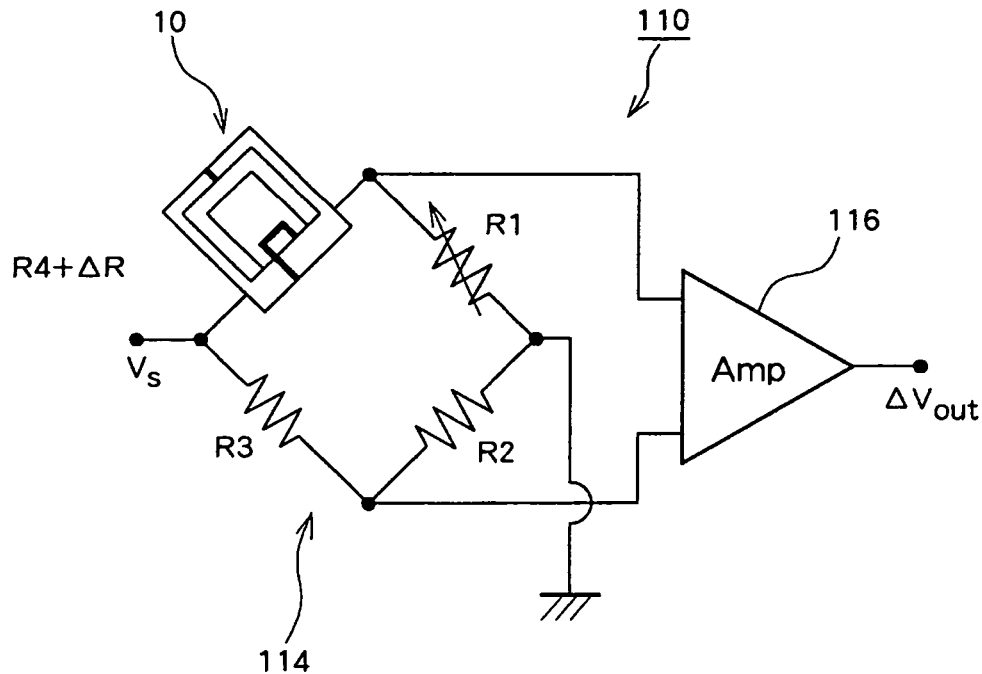
FIG. 8 is a circuit diagram showing one example of a detecting circuit.
FIG. 9 is a view showing results of liquid leak tests.

FIG. 8 shows a configuration example of the detecting circuit 110 shown in FIG. 7. One example of the detecting circuit which is actually used together with the pressure sensor is the detecting circuit 110 shown in FIG. 8. The detecting circuit 110 has a bridge circuit 114. The bridge circuit 114 has a resistance R1, a resistance R2 and a resistance R3, and further has a pressure sensor 10 which has a resistance R4+$\Delta$R. Here, R4 represents a piezoresistance value (initial value) of the cantilever in an original attitude, and $\Delta$R represents the degree of the change with respect to the initial value of the piezoresistance value. A voltage Vs is given to the bridge circuit 114 from an unillustrated power supply. The output of the bridge circuit 114 is output from a differential amplifier 116, as a voltage $\Delta V_{out}$. The signal is given to the oscilloscope. In other words, the detecting circuit 110 shown in FIG. 8 can take out the degree of change $\Delta$R of the piezoresistance value as a voltage $\Delta V_{out}$. Of course, the circuit configuration shown in FIG. 8 is only one example.

FIG. 9 shows a result of a liquid leak test. For this liquid leak test, the experimental system shown in FIG. 7 has not been used, but the test has been conducted by using a simple body of the pressure sensor shown in FIG. 5. Incidentally, this test has been conducted in a state in which there is no difference between the pressure in the air cavity and the outside pressure, at 23 degrees centigrade. As is denoted by reference numeral 118, test objects are four pressure sensors each having a different gap size from others. Four sizes of 1 µm, 3 µm, 5 µm and 10 µm are selected as the gap size. Three types of liquids as denoted by reference numerals 120, 122 and 124 are applied to such four gap sizes. The first liquid shown by the reference numeral 120 is a silicone fluidic oil HIVAC F-5 which is produced by Shin-Etsu Chemical Co., Ltd., and a second liquid 122 is a silicone fluidic oil HIVAC F-4 which is produced by the same company. A third liquid 124 is water.

As is shown in FIG. 9, when the water is used, even when the gap size is 10 µm, the leak does not occur. On the other hand, when the first liquid 120 is used, the leak occurs in 5 µm and 10 µm, but the leak does not occur in 3 µm. When the second liquid 122 is used, the leak occurs in 10 µm, but the leak does not occur in 5 µm. The first liquid 120 and the second liquid 122 are recognized to have an approximately similar surface tension, and as for the reason why the gap sizes at which the leak starts occurring are different between the liquids, factors other than the surface tension and a possibility of an error can be indicated. However, in any case, it can be said that in the case where the silicone fluidic oil such as the first liquid 120 and the second liquid 122 is used, the gap size is preferably set at 3 or 5 µm or less. On the other hand, in the case of the water, it is desirable to set the gap size at 10 µm or less, and in some cases, it is also possible to set the size at 10 µm or more. It is desirable to test various liquids, select a liquid to be used on the basis of the result obtained by the test, and select the gap size.

For information, FIG. 10 to FIG. 13 show results of tests in which the experimental system shown in FIG. 7 has been used.

Figure 10:
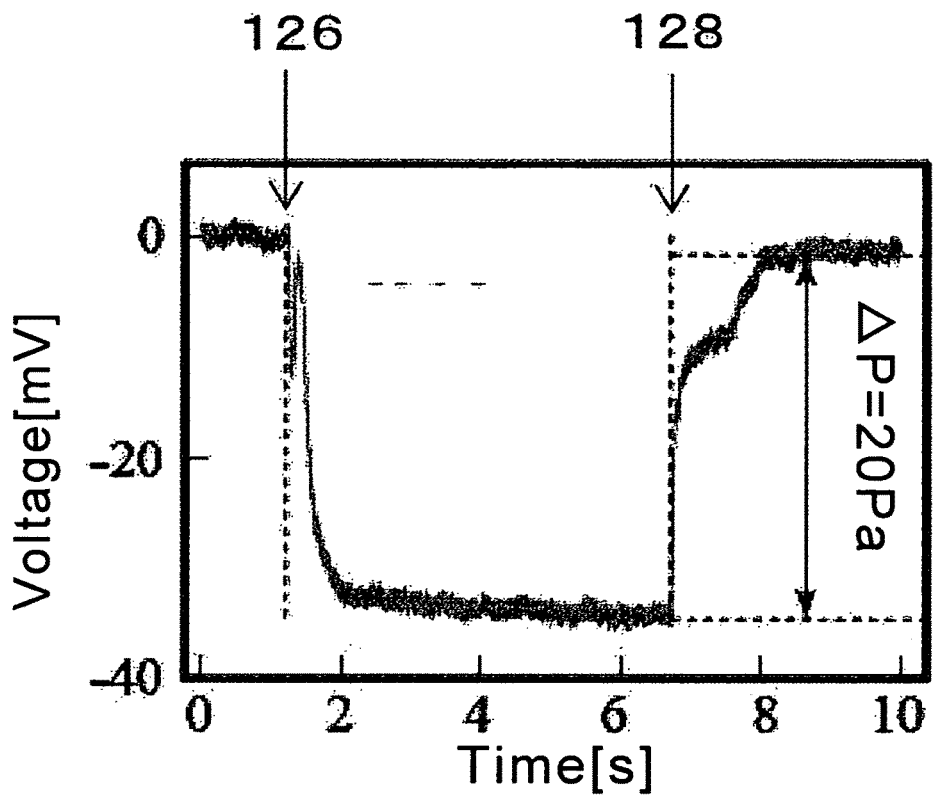
FIG. 10 is a view showing a result of a resolution test.

FIG. 10 shows a result of a resolution test. In this experiment, 20 Pa is set as a pressure difference $\Delta P$. In this test, the first liquid is used as the liquid, and a pressure sensor having a gap size of 1 µm is used. The test has been performed at a temperature of 25 degrees. Incidentally, in the test, the liquid leak is not observed. Reference numeral 126 denotes a timing at which the pressure application has been started, and reference numeral 128 denotes a timing at which the pressure application has been ended. Incidentally, a horizontal axis is a time axis, and a vertical axis represents voltage. In the waveform of an oscilloscope shown in FIG. 10, 0.9 Pa is calculated as the resolution, from a ratio of a signal to a noise in the case where 20 Pa has been given. In other words, the pressure sensor of the present embodiment can provide an extremely high resolution.

Figure 11:
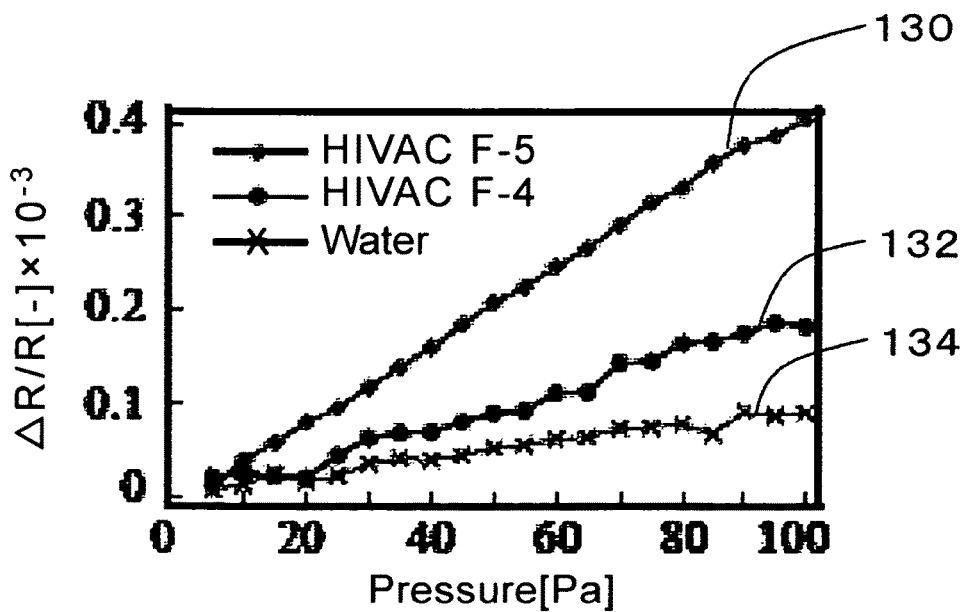
FIG. 11 is a view showing a result of a liquid dependency test.

FIG. 11 shows a result of a liquid dependency test. A horizontal axis represents a pressure, and a vertical axis represents a change rate ($\Delta$R/R) of the piezoresistance value. Incidentally, in this test, a pressure sensor having the gap size of 3 µm is used. Reference numeral 130 denotes characteristics of the first liquid, reference numeral 132 denotes the characteristics of the second liquid, and reference numeral 134 denotes the characteristics of the third liquid. Incidentally, a dynamic viscosity (degree of dynamic viscosity) of the first liquid is 160 mm$^2$/s, the dynamic viscosity of the second liquid is 37 mm/s, and the dynamic viscosity of the third liquid, in other words, water is 1 mm$^2$/s. All of those values are values which have been measured at 25 degrees centigrade. As is shown in this FIG. 11, it can be understood that a liquid having higher dynamic viscosity shows higher sensitivity.

Figure 12:
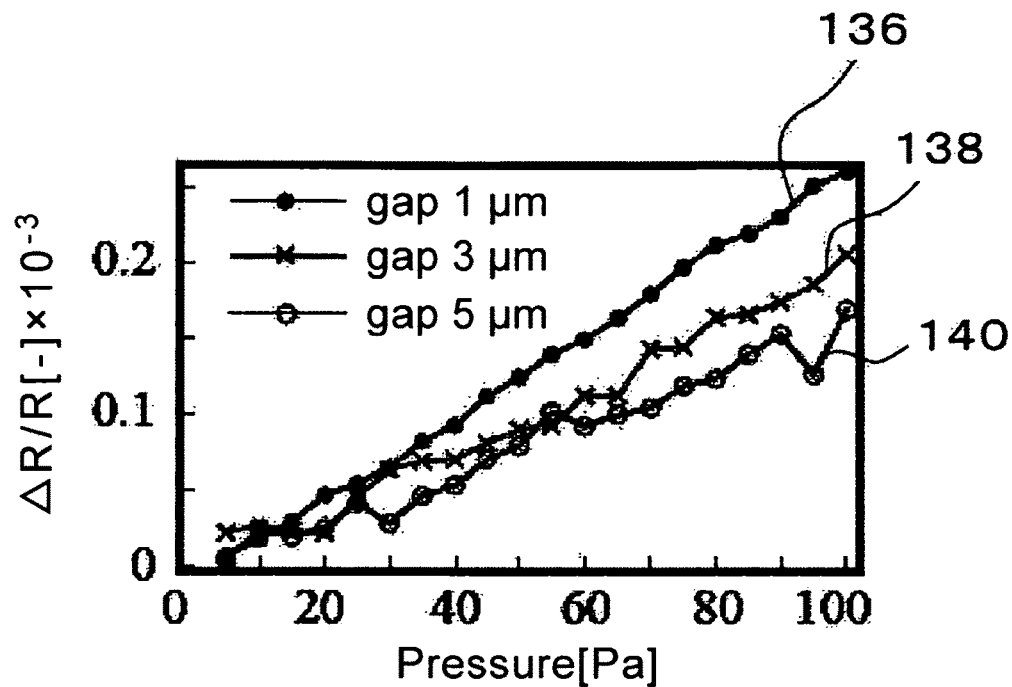
FIG. 12 is a view showing a result of a gap size dependency test.

FIG. 12 shows a result of a gap size dependency test. In FIG. 12, a horizontal axis represents a pressure, and a vertical axis represents a change rate of the piezoresistance value. A liquid to have been used is the second liquid. Reference numeral 136 denotes the characteristics in the case where the gap size is 1 µm, reference numeral 138 denotes the characteristics in the case where the gap size is 3 µm, and reference numeral 140 denotes the characteristics in the case where the gap size is 5 µm. Incidentally, in the case where the gap size has been 10 µm in the second liquid, a leak has occurred, and accordingly the characteristics are not shown. As is shown in FIG. 12, it can be understand that a smaller gap shows more adequate stability.

Figure 13:
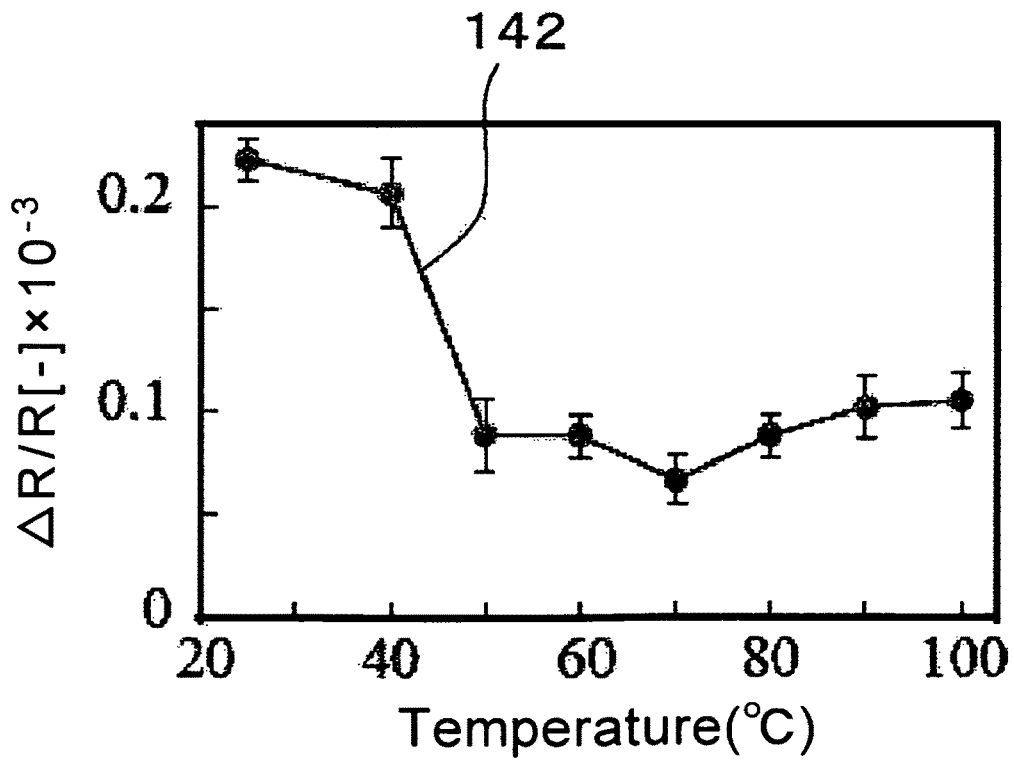
FIG. 13 is a view showing a result of a temperature dependency test.

FIG. 13 shows a result of a temperature dependency test. In FIG. 13, a horizontal axis represents a temperature, and a vertical axis represents a change rate of a piezoresistance value. A liquid to have been used is the second liquid, and in the test, a pressure sensor having a gap size of 3 μm is used. A pressure difference ΔP which has been applied to the pressure sensor is 100 Pa. Incidentally, three times of measurements have been conducted at each temperature, and a curve 142 is a curve which has connected those average values. As is shown in FIG. 13, it is recognized that the resistance values vary depending on the temperature. Accordingly, as will be described later, it can be said that a temperature compensation system is desirably used in combination.

(4) Modified Example of Pressure Sensor (a) Modified Example 1

Figure 14:
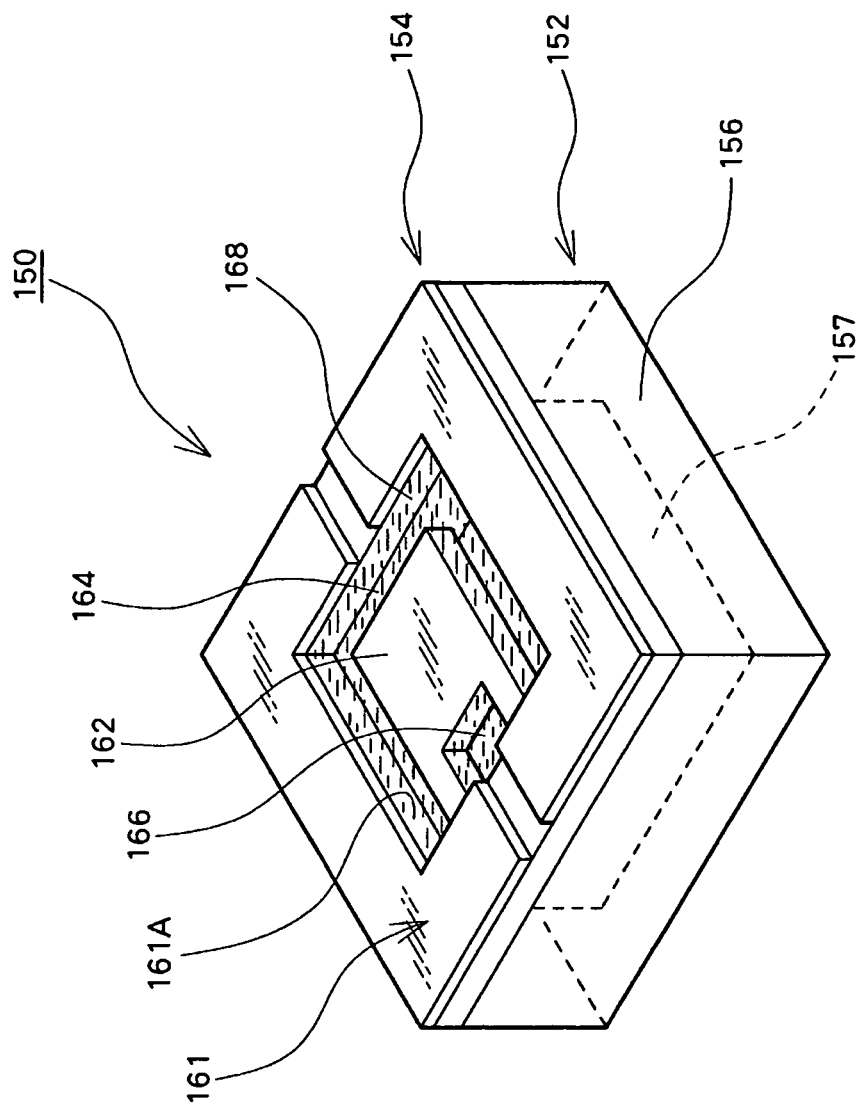
FIG. 14 is a perspective view showing a pressure sensor in which a liquid is locally provided with respect to the gap.

FIG. 14 shows a structure example of a pressure sensor in which a liquid is locally provided with respect to the gap. The pressure sensor 150 has a basically similar structure to that of the pressure sensor 10 shown in FIG. 1, except that the liquid is locally provided. Specially, the pressure sensor 150 is formed of a lower side structure 152 and an upper side structure 154, and the lower side structure 152 has a container 156 which has an air cavity 157. The upper side structure 154 has a cantilever 162, and a frame 161 provided around the cantilever 162. A gap 164 is formed between the cantilever 162 and the frame 161. A hole 166 is formed between two legs which the cantilever 162 has. In the pressure sensor 150 shown in FIG. 14, a liquid 168 is locally provided in the inside of the gap 164 and the hole 166. In other words, opening parts thereof are sealed by the liquid 168. The liquid 168 is not provided up to the upper face of the cantilever 162. Similarly, the liquid 168 is not provided also on the upper face of the frame 161. As a result, it is possible to seal the opening parts locally and besides effectively with the use of an extremely small amount of the liquid 168.

Figure 15:
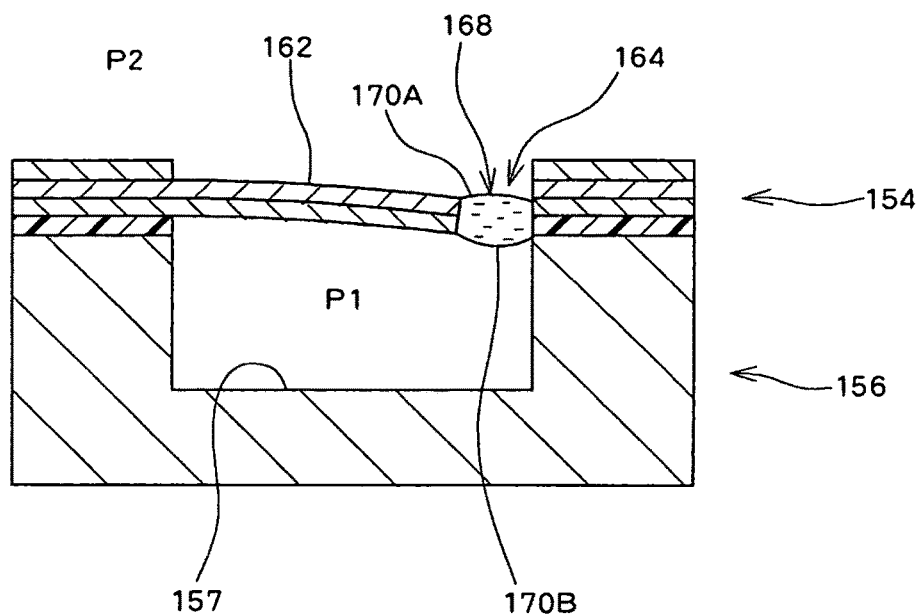
FIG. 15 is a sectional view of the pressure sensor shown in FIG. 14.

FIG. 15 shows a cross section of the pressure sensor shown in FIG. 14. The liquid 168 is retained by a gap 164 formed between the cantilever 162 and the frame 161, and thereby the gap 164 is sealed by the liquid 168. The upper face of the liquid 168 is an interface 170A between the outside and the liquid 168, and the lower face of the liquid 168 is an interface 170B between air in the air cavity 157 and the liquid 168. The surface tension of the liquid 168 acts on the interfaces 170A and 170B.

As is shown in FIG. 15, even though the cantilever 162 has been deformed, the liquid 168 results in moving or being deformed while following the deformation, and the sealed state of the gap 164 is always maintained. In such a state, the cantilever 162 is deformed according to a pressure P2 of the outside with reference to an inner pressure P1 of the air cavity, and the deformation is electrically detected as a change of the piezoresistance value. In this case, the gap 164 is sealed by the liquid 168, and the liquid leak and the air leak do not occur. In the structure example shown in FIG. 15, the liquid 168 is not placed on the upper face of the cantilever 162, and accordingly the pressure P2 of the outside results in being exerted directly on the cantilever 162. Accordingly, the responsibility can be enhanced. In addition, the liquid does not exist also on the upper face of the cantilever 162 as well as on the lower face, and accordingly a reactive force to be generated when the cantilever 162 moves is extremely small, which can provide an advantage of being capable of more enhancing sensitivity and responsibility.

Figure 16:
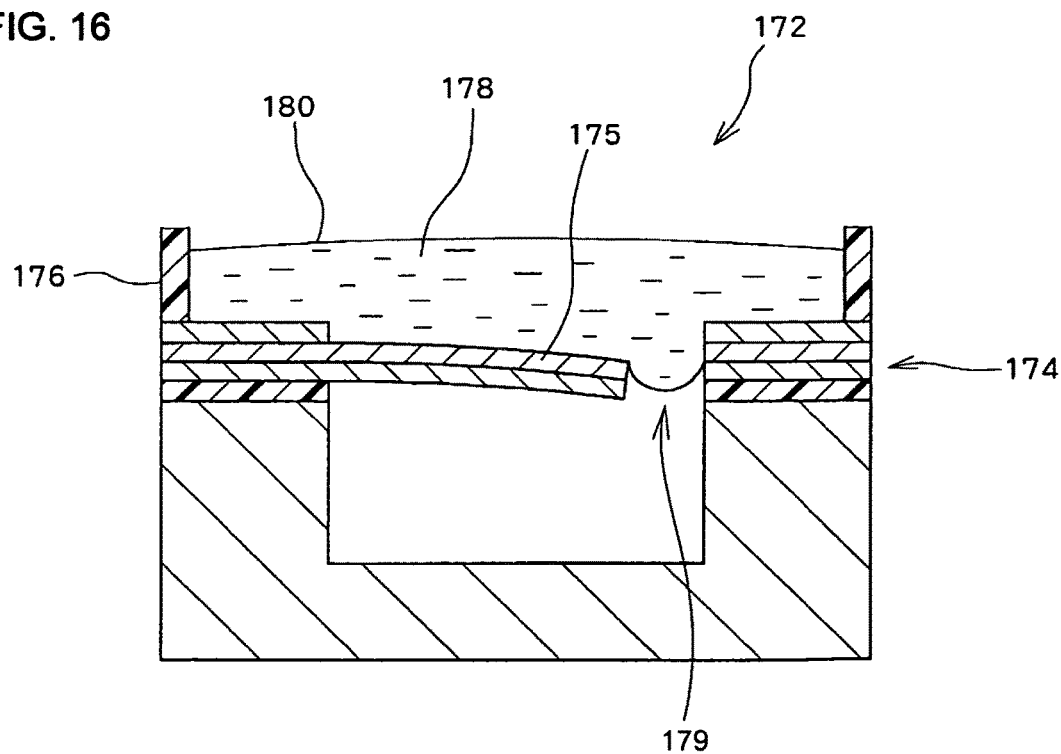
FIG. 16 is a sectional view showing a pressure sensor having a frame member.

FIG. 16 shows a pressure sensor having a frame member which retains a liquid therein. FIG. 16 shows a cross section thereof. The pressure sensor 172 has an upper side structure 174 similar to that in the pressure sensor shown in FIG. 1. In other words, the upper side structure 174 has a cantilever 175. A frame member 176 having a circular or rectangular shape is provided on an upper side of the upper side structure 174. A liquid 178 is introduced in the inside of the frame member 176. Thus, the shape of the upper face 180 of the liquid 178 can be appropriately changed by using the frame member 176 or the like. In any case, it is desirable to appropriately select the type, the form to be retained, the quantity and the like of the liquid 178 so that the gap 179 can be sufficiently sealed.

Figure 17:
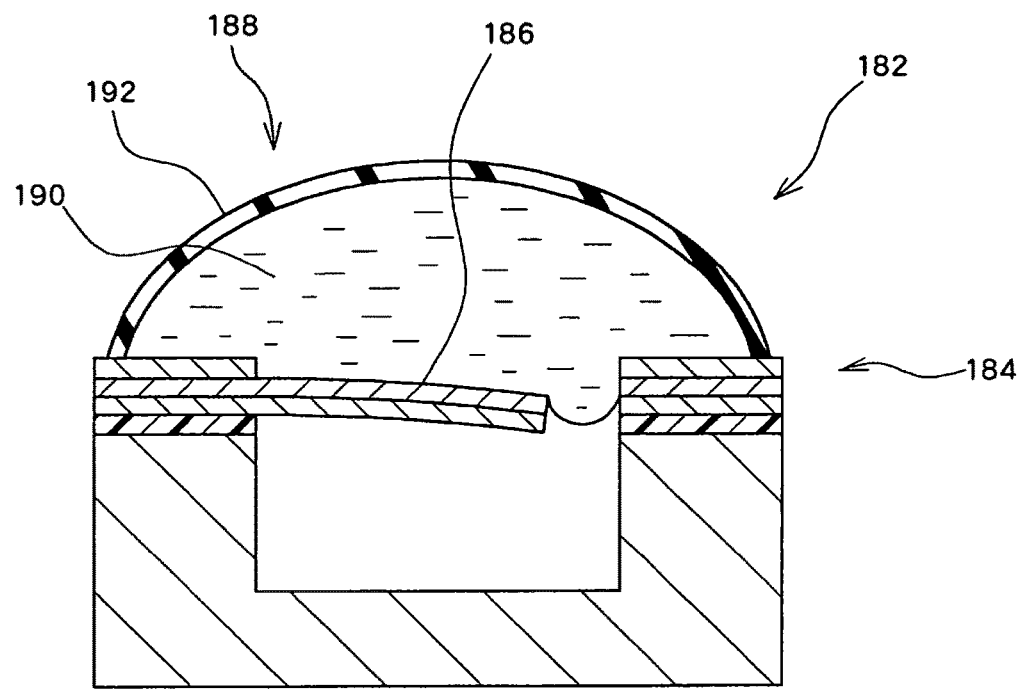
FIG. 17 is a sectional view showing a pressure sensor having a film.

FIG. 17 shows an example of a pressure sensor having a film on an upper face of an upper side structure. The pressure sensor 182 has the upper side structure 184 similar to that of the pressure sensor shown in FIG. 1, and the upper side structure 184 has a cantilever 186. A liquid 190 is provided on the upper face of the upper side structure 184. However, the liquid 190 is not exposed to the outside, but the liquid 190 is accommodated in the inside of the film 192. It is desirable that the film 192 is formed from a material having flexibility, and is formed as a thin film so as to sufficiently transmit a pressure exerted from the outside. A material which forms the film 192 can include a paraxylene-based polymer. However, the film 192 may be formed from another resin or a material other than resin.

As has been described above, in the structure example shown in FIG. 17, a liquid unit 188 is formed which is formed of the film 192 and the liquid 190. Such a liquid unit 188 can provide an advantage of being capable of preventing a problem of evaporation even when having used the liquid 190 having a high vapor pressure. Accordingly, a degree of flexibility in the selection of the liquid can be widened. In addition, the liquid 190 is retained in a hermetically-closed space, accordingly which can provide also an advantage of being capable of preventing or reducing the deterioration. However, when forming the film 192 on the liquid 190, it is desirable to select the type of the liquid 190 so as to satisfy the film-forming condition, and select the material of the film 192.

Figure 18:
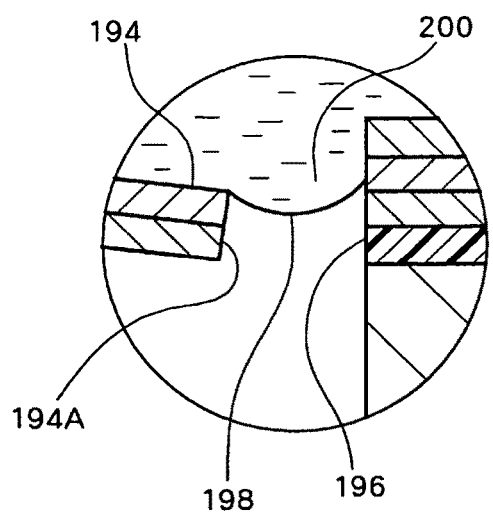
FIG. 18 is a view showing a second example of an interface.
Figure 19:
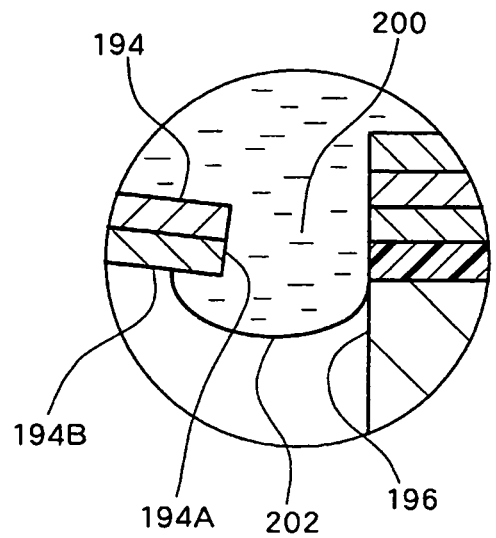
FIG. 19 is a view showing a third example of the interface.
Figure 20:
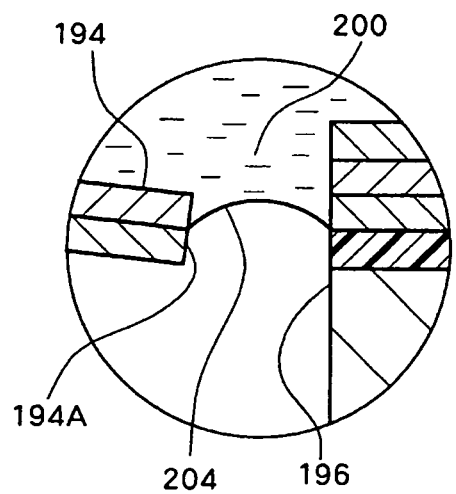
FIG. 20 is a view showing a fourth example of the interface.

FIG. 18 to FIG. 20 illustrate various interfaces. The interfaces shall be a second example to a fourth example with respect to the first example of the interface shown in FIG. 2. In the second example shown in FIG. 18, an interstice between an outside face 194A which forms a leading end face of a cantilever 194, and an inside face 196 of the opening is a gap 200. An interface 198 is formed in the gap 200. The interface 198 is positioned in a comparatively upper part in the gap 200, and has a form of being convex toward the lower side. In the third example shown in FIG. 19, the liquid exceeds the gap 200 and is squeezed down to the vicinity of the lower side of the gap, and thereby an interface 202 is formed which exceeds the lower side of the gap 200 and swells to have a form of being convex to the lower side. Even when the interface 202 has thus reached the vicinity of the gap, the sealing action can be obtained, as long as this interface 202 can be maintained. In the fourth example shown in FIG. 20, an interface 204 is formed which has a convex shape (concave shape in lower side) toward the upper side in an intermediate position in the gap 200. It is considered that the interface 204 having such a form is also formed depending on the properties of the liquid and the composition of each wall face. It is also considered that the interface 204 shown in FIG. 20 is formed so as to exceed the upper side of the gap 200 depending on a pressure difference. Thus, the interfaces having various forms can be formed at various positions according to various conditions. This is also true for the case in which the liquid is locally provided as shown in FIG. 17. In any case, it is desirable to set various conditions so that the liquid surely seals the gap 200 regardless of the movement of the cantilever 194, and the liquid leak and the gas leak do not occur through the gap 200.

Figure 21:
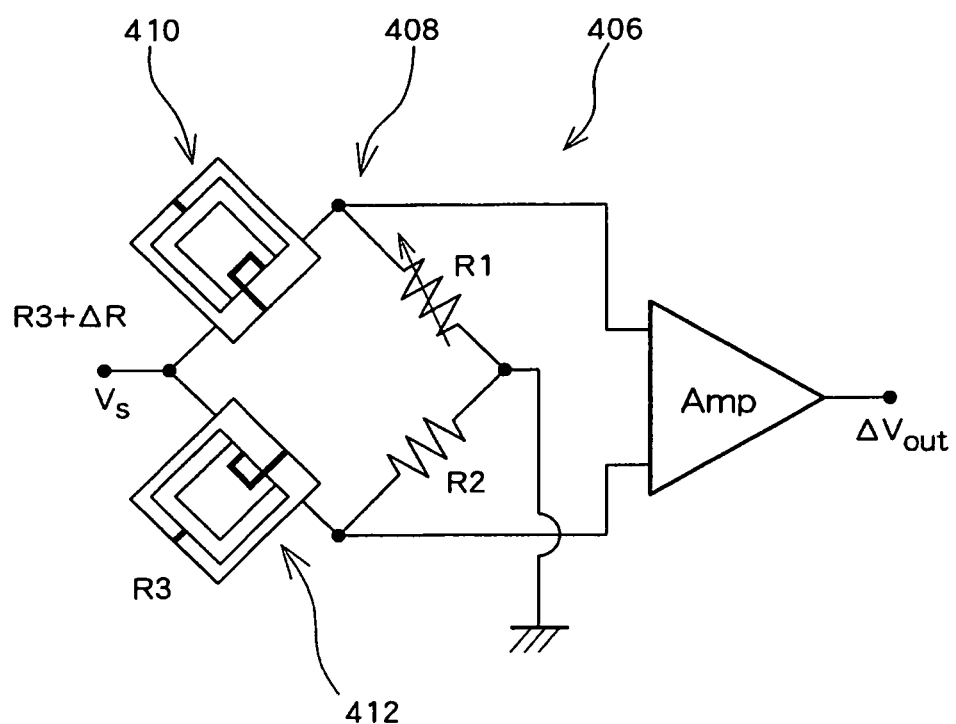
FIG. 21 is a view showing a circuit structure having a temperature compensation function.

FIG. 21 shows a configuration example of a circuit which has a temperature compensation function. A detecting circuit 406 has a bridge circuit 408. A pressure sensor 410 is provided as a component corresponding to one resistance in the bridge circuit 408, and a dummy sensor 412 is provided as a component corresponding to another resistance. The dummy sensor 412 has a dummy cantilever which does not move even by a pressure of the outside. The dummy cantilever is a component having the same temperature characteristics as those of the cantilever which the pressure sensor 410 has. In other words, change rates of the resistance with respect to the temperature in the cantilever and the dummy cantilever are equal to each other. Thereby, it is possible to cancel an influence of temperature variation by using both of the cantilever and the dummy cantilever. In the dummy sensor 412, the air cavity does not particularly need to be provided.

Figure 22:
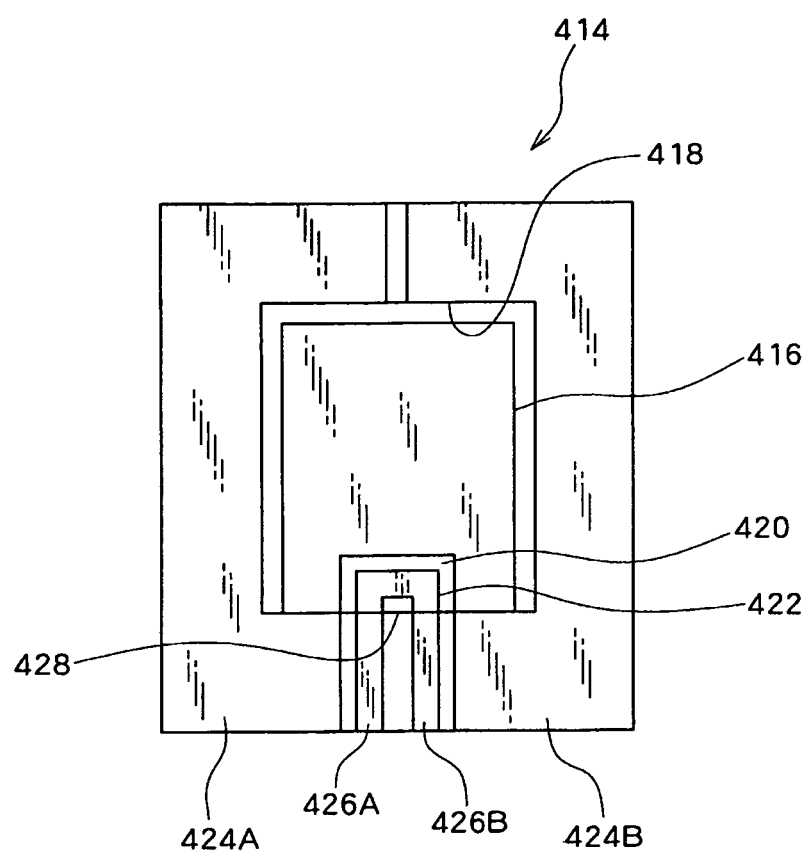
FIG. 22 is a view showing a cantilever structure having a temperature compensation element.

FIG. 22 shows a cantilever structure having an element for temperature compensation. A pressure sensor 414 has a cantilever 416, and a gap 418 is formed around the cantilever 416. An element 422 is provided between two legs which the cantilever 416 has. The element 422 is a component which generates a resistance depending on temperature, and may be a temperature sensor, for instance. An opening 420 is formed between the element 422 and the cantilever 416. An opening 428 is also formed between the bifurcated legs which the element 422 has. Reference numeral 424A and reference numeral 424B denote a pair of electrodes which are connected to the cantilever 416; and reference numeral 426A and reference numeral 426B denote a pair of electrodes which are connected to the element 422. It is also possible that the element constitutes a part of the cantilever. It is also acceptable to form a recess having such a degree of depth that a piezoresistive layer can be surely removed, for instance, 200 nm, in a portion between a pair of legs which the cantilever has, in the cantilever having a thickness, for instance, of 300 nm, and to use a remaining portion having a thickness of 100 nm as the element for the temperature compensation. In addition, the element may be provided as a part of a frame, and may also be provided in the air cavity.

It is possible to make the element 422 output a signal in response to the temperature of the cantilever 416 by using such a pressure sensor 414 having such a temperature dependent element, and to subject the piezoresistance value which the cantilever 416 has, to the temperature compensation that uses the signal. It is also possible to previously determine the temperature characteristics in the cantilever 416, detect the actual temperature with the temperature sensor, and apply a correcting operation for the temperature compensation to a signal output from a detection unit on the basis of the detection value.

(b) Modified Example 2

(i) Whole Structure

Figure 23:
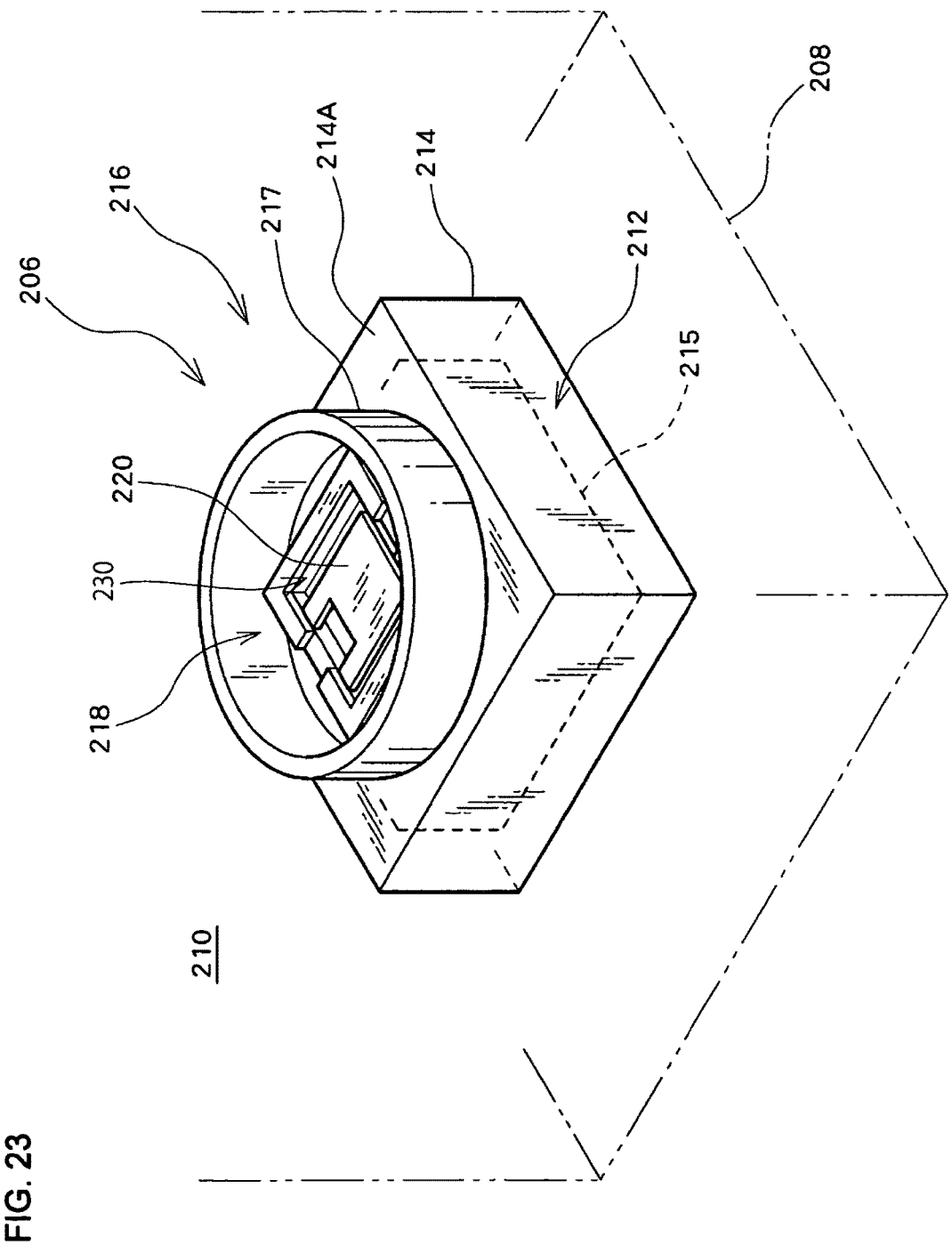
FIG. 23 is a perspective view showing a pressure-sensitive sensor which is a type of being arranged in a liquid, as another embodiment of the present invention.

FIG. 23 shows a hydrophone 206 as an application example of a pressure sensor. This hydrophone 206 is a unit which detects a pressure (sound) in water.

The hydrophone 206 has basically a similar structure to that of the pressure sensor shown in FIG. 1. Specifically, the hydrophone 206 has a lower side structure 212 and an upper side structure 216. The lower side structure 212 has a container 214 which has an air cavity 215. The upper side structure 216 has a cantilever unit 218. The cantilever unit 218 has a cantilever 220, and a frame 228 around the cantilever 220. As will be shown later in FIG. 24, the cantilever unit 218 is joined and fixed onto an upper face 214A of the container 214.

As is shown in FIG. 23, the hydrophone 206 does not have a liquid in an initial state, and when the hydrophone 206 is arranged in a water tank 208, a gap 230 is sealed. In order to enhance sound-collecting properties and also protect the cantilever unit 218, a frame body 217 is provided on the upper face 214A. In the illustrated example, the frame body 217 having a cylindrical shape is provided. A liquid (specifically, water) 210 is contained in the water tank 208, and when the hydrophone 206 is placed in the inside of the water tank 208, the gap 230 results in being sealed by the liquid 210, similarly to the structure examples shown in FIG. 1 and the like.

Figure 24:
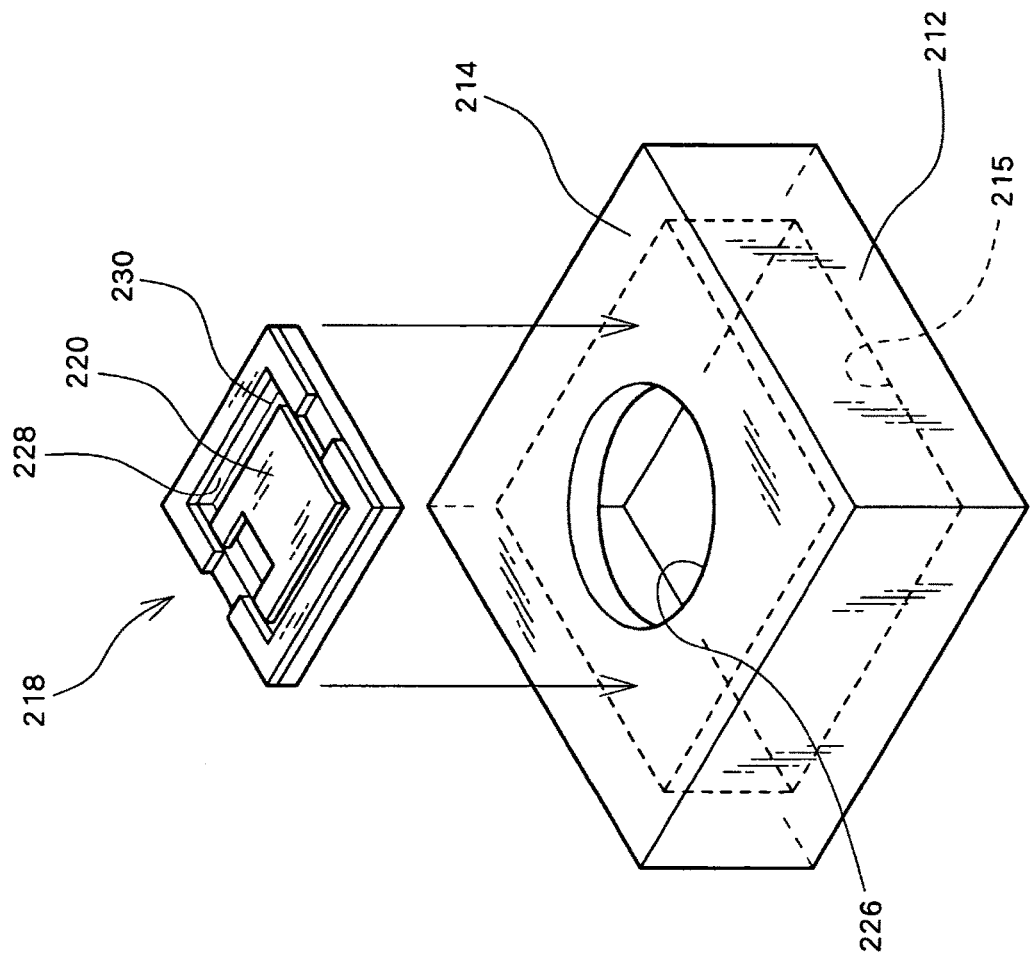
FIG. 24 is a perspective view showing a hydrophone shown in FIG. 23.

The hydrophone 206 shown in FIG. 23 is shown as a perspective view, in FIG. 24. In the lower side structure 212, the air cavity 215 is formed in the container, and a circular opening 226 is formed in the upper face of the lower side structure 212. The cantilever unit 218 is joined and fixed onto the upper face 214A. Specifically, the cantilever 220 is provided so as to cover the opening 226. A space between the cantilever 220 and the frame 228 is the gap 230.

Figure 25:
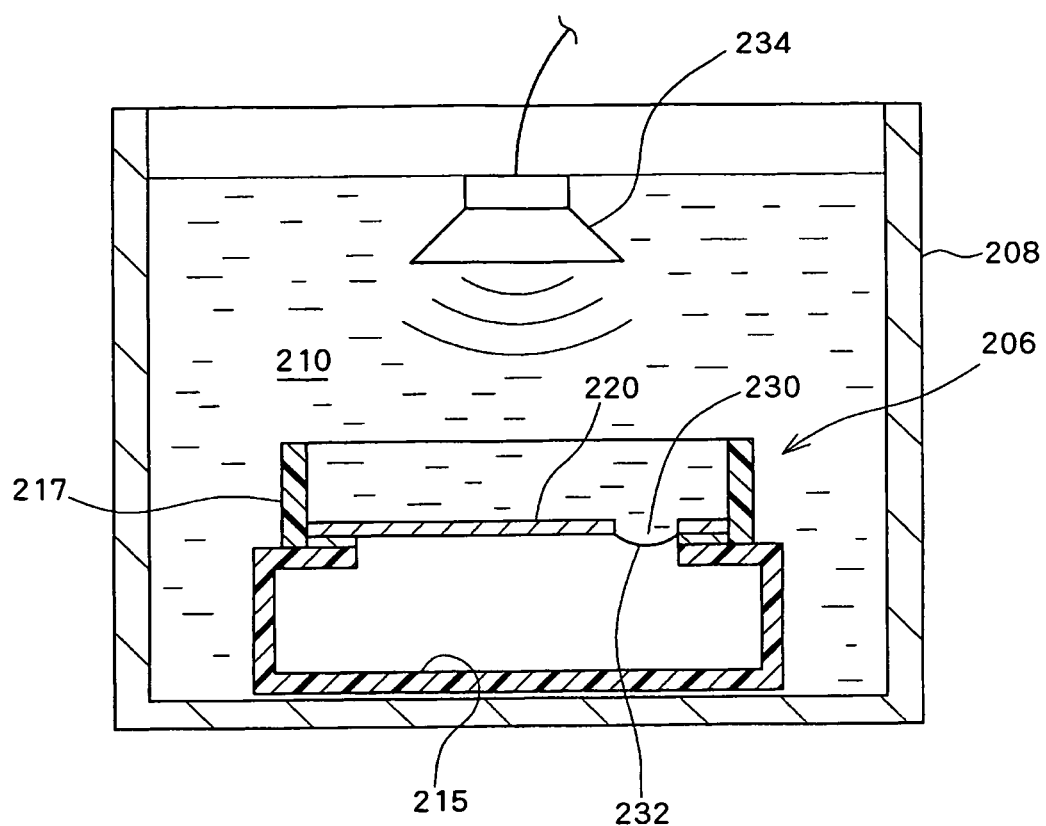
FIG. 25 is a schematic view showing an example in which the hydrophone shown in FIG. 23 is used.

FIG. 25 shows an example in which the hydrophone 206 shown in FIG. 23 is used, as a schematic view. The water which is the liquid 210 is accommodated in the water tank 208. The hydrophone 206 is fixedly set upward on a lower part of the water tank 208. The liquid 210 enters the inside of the frame body 217, and the liquid 210 exists on the upper side of the cantilever 220. An interface 232 is formed in the gap 230 between the liquid 210 and the gas in the air cavity 215. The gap 230 is sealed by the liquid which has entered the gap 230.

A speaker 234 is provided on an upper part of the water tank 208. When the speaker 234 outputs a sound, the sound propagates in the liquid 210, and makes the cantilever 220 periodically move. In this case, the interface 232 is maintained, and the sealed state of the gap 230 is kept. The movement of the cantilever 220 is detected as a change of the piezoresistance value, and thereby the sound can be detected.

The hydrophone 206 shown in FIG. 23 to FIG. 25 can seal the gap 230 by using water in the water tank as it is, and accordingly the liquid does not need to be separately prepared when the hydrophone is used, and the gap 230 can be extremely simply sealed. Similarly to the embodiment shown in FIG. 1, this hydrophone 206 also has the air cavity 215 in the lower side of the cantilever 220, and accordingly a reactive force to be generated when the cantilever 220 moves is small. Thereby, adequate sensitivity and adequate responsibility can be obtained.

Figure 26:
FIG. 26 is a view showing a hydrophone which has been actually manufactured.
Figure 27:
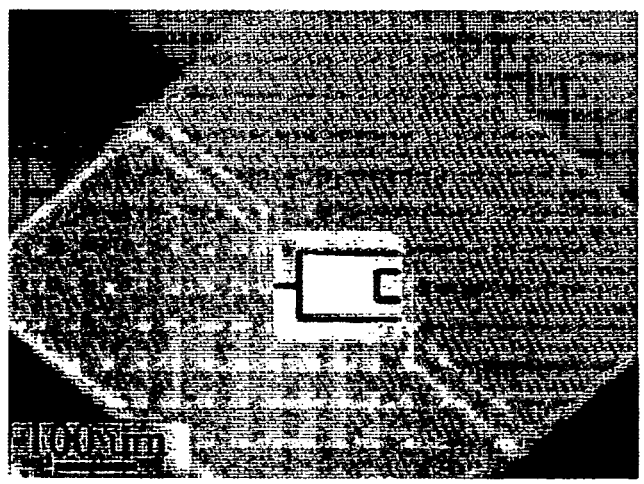
FIG. 27 is a view showing a sensor chip which the hydrophone has.

FIG. 26 shows a hydrophone which has been actually manufactured. In addition, FIG. 27 shows a sensor chip which the hydrophone shown in FIG. 26 has. A cantilever is formed which has an inclination angle of 45 degrees against a crystal direction of silicon. Such a structure is general.

(ii) Evaluation of Characteristics

Figure 28:
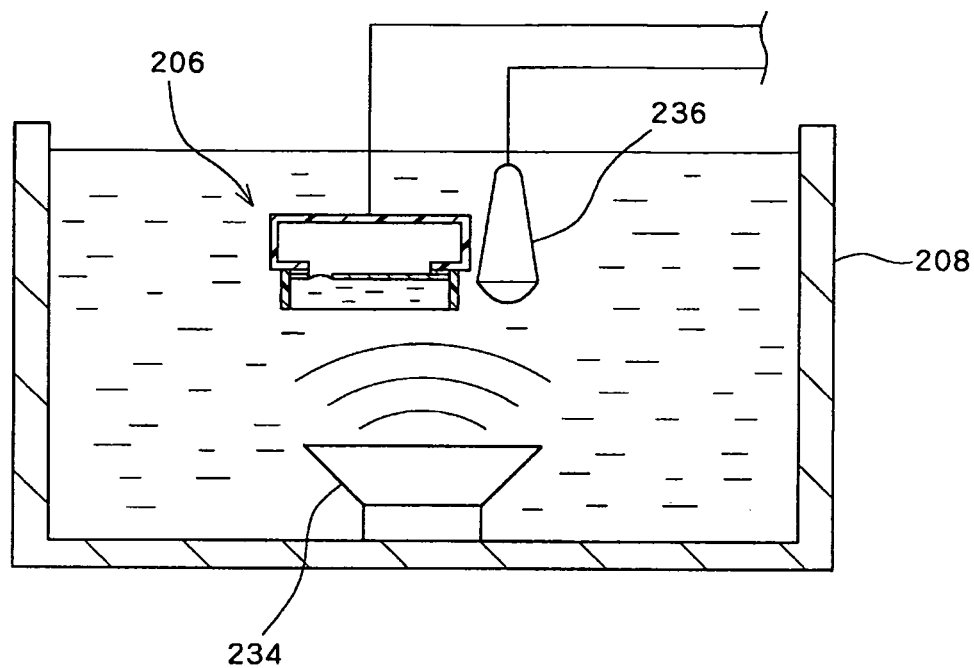
FIG. 28 is a schematic view showing an experimental system for testing a performance of the hydrophone.

FIG. 28 shows an experimental system which has been used for testing the performance of the hydrophone. A speaker 234 is provided upward in the inside of the water tank 208 which accommodates water as a liquid. The hydrophone 206 shown in FIG. 23 is set downward in the upper part of the water tank 208. A microphone 236 which functions as a reference is set downward side by side with the hydrophone 206. A hydrophone (Type 8103) made by Brüel & Kjær Sound & Vibration Measurement A/S has been used as the microphone 236. Incidentally, Fostex US300 has been used as the speaker 234.

Figure 29:
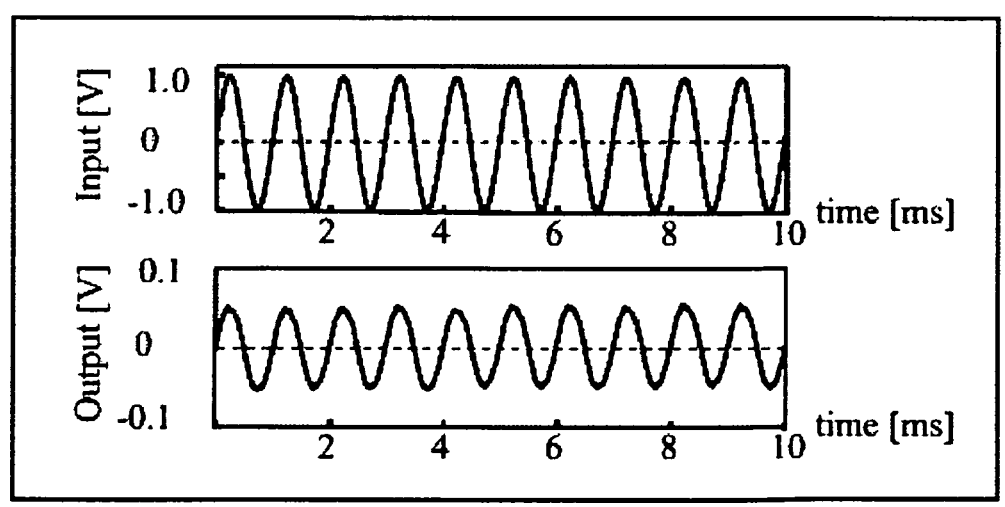
FIG. 29 is a view showing response characteristics of the hydrophone.

FIG. 29 shows response characteristics of the hydrophone of the present embodiment. A waveform shown in the upper stage shows a signal (frequency of 1 kHz) input from the speaker. The horizontal axis is a time axis, and the vertical axis represents the amplitude which is a voltage value. A waveform shown in the lower stage of FIG. 29 shows a signal which has been detected by the hydrophone according to the present embodiment. As is shown in FIG. 29, the transmitted waveform is accurately reproduced, and the response characteristics are also adequate.

Figure 30:
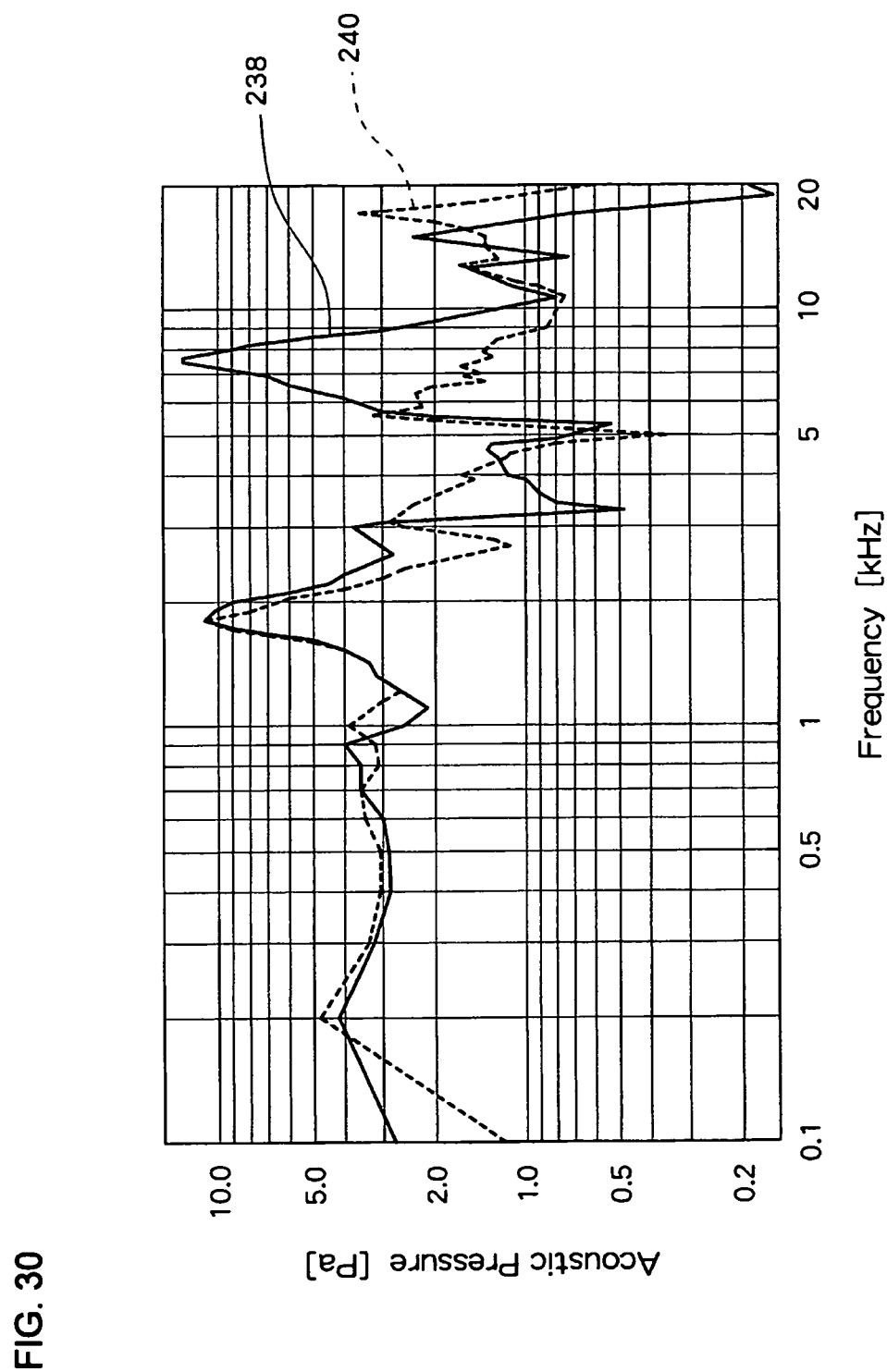
FIG. 30 is a view showing frequency characteristics of the hydrophone.

FIG. 30 is a view showing frequency characteristics (relationship between frequency and sound pressure) of the hydrophone. The horizontal axis represents the frequency, and the vertical axis represents an acoustic pressure. Reference numeral 238 denotes the frequency characteristics of the hydrophone according to the present embodiment, and reference numeral 240 denotes the frequency characteristics of the hydrophone (hydrophone made by Brüel & Kjær Sound & Vibration Measurement A/S) which works as the reference. As is illustrated, the hydrophone of the present embodiment provides adequate frequency characteristics which are similar to those of the reference, in a range of 100 Hz to 20 KHz.

Figure 31:
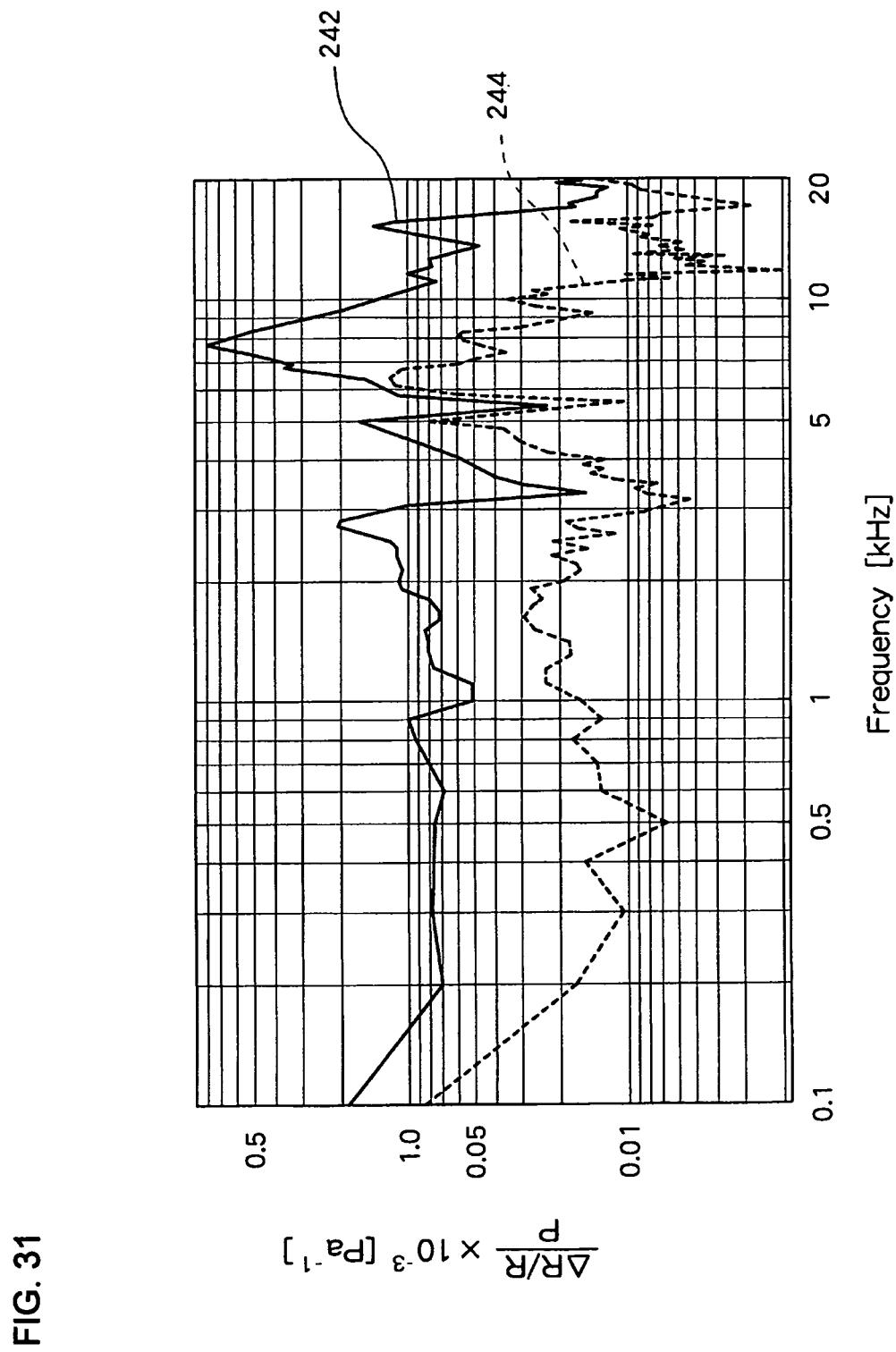
FIG. 31 is a view showing other frequency characteristics of the hydrophone.

FIG. 31 shows frequency characteristics (relationship between frequency and change rate of resistance value per unit pressure) of the hydrophone. The horizontal axis represents a frequency, and the vertical axis represents a change rate of a resistance value per unit pressure. Reference numeral 242 denotes the characteristics of the hydrophone according to the present embodiment, and reference numeral 244 denotes the characteristics of a comparative example. The comparative example is a hydrophone which has the same structure as that of the hydrophone in the embodiment, and in which the inside of the air cavity is filled with a liquid. As is illustrated, the hydrophone of the present embodiment can show approximately 5 times the sensitivity as compared to the comparative example, in a range of 100 Hz to 5 KHz.

(c) Modified Example 3

Figure 32:
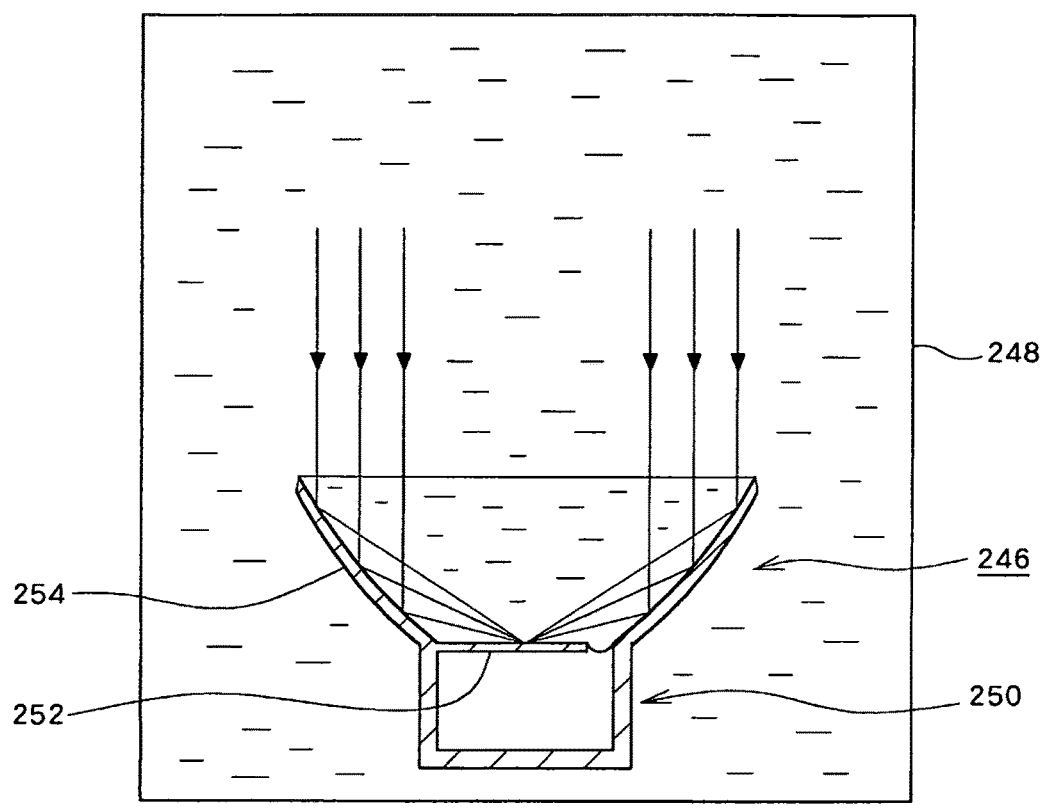
FIG. 32 is a schematic view showing a hydrophone having a sound-collecting structure.

FIG. 32 shows a modified example of the hydrophone. A hydrophone 246 has a lower side structure 250, and a cantilever 252 is provided so as to cover the air cavity in the inside thereof. An upper structure of the hydrophone 246 has a sound guide 254. The sound guide 254 has a parabola shape which spreads upward, and shows a function of reflecting or guiding a sound from the upper part toward a cantilever 252 side. Thereby, sound-collecting efficiency can be enhanced and sensitivity for an orientation direction can be enhanced.

Figure 33:
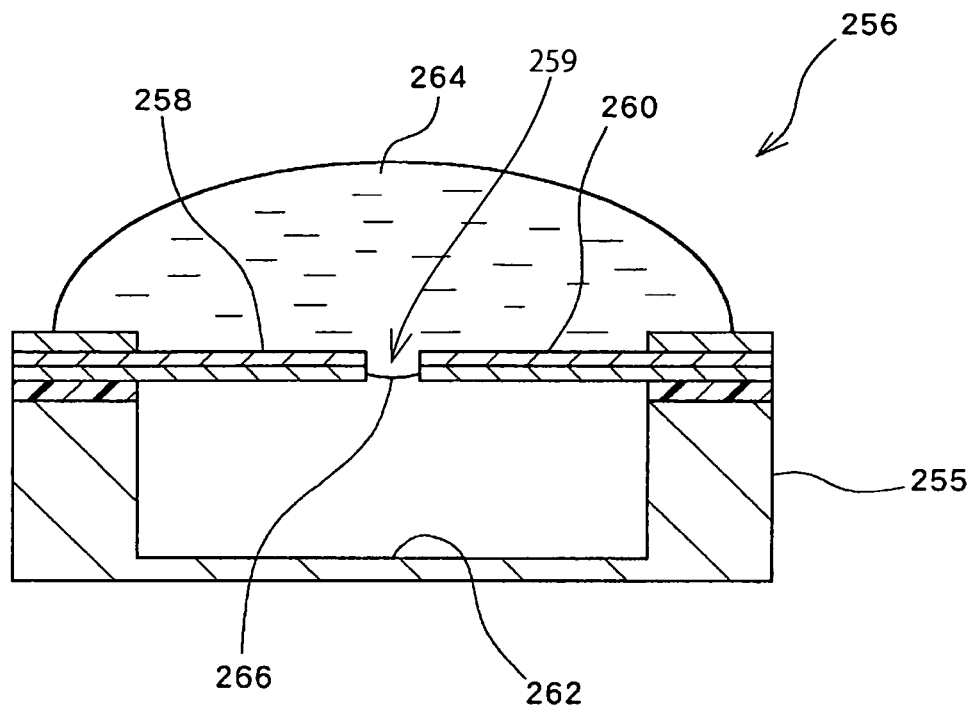
FIG. 33 is a sectional view showing a pressure sensor having a plurality of cantilevers.

FIG. 33 shows a pressure sensor 256 having a plurality of cantilevers. The pressure sensor 256 has a main body 255, and the inside thereof is a common air cavity 262. On the upper part of the main body 255, two cantilevers 258 and 260 which have a line symmetry relationship are provided in mutually reverse directions. A liquid 264 is provided so as to step over the cantilevers. In such a structure, a gap 259 is formed between a first cantilever 258 and a second cantilever 260, and the gap 259 is sealed by the liquid 264. Reference numeral 266 denotes an interface in the sealed gap 259. The first cantilever 258 and the second cantilever 260 have basically the same structure, and accordingly when a pressure exerted from the outside is exerted on the cantilevers, the two cantilevers 258 and 260 are similarly deformed. Along with the deformation, the interface 266 also results in moving. However, the sealed state by the liquid 264 is maintained. The common air cavity 262 is provided in the inside of the main body 255, and thereby the structure is simplified. Three or more cantilevers can also be arranged to constitute the pressure sensor.

Figure 34:
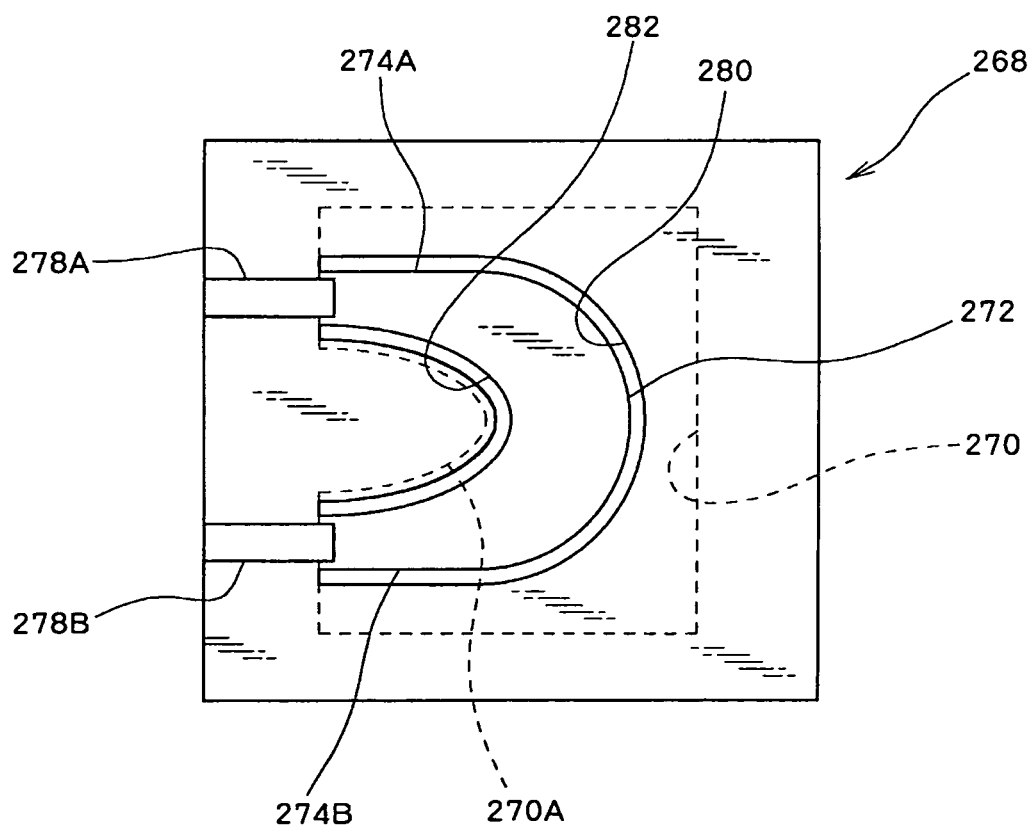
FIG. 34 is a plan view showing a pressure sensor having a cantilever having a curved form.

FIG. 34 shows a pressure sensor having a non-rectangular shape of a cantilever. A pressure sensor 268 has a cantilever 272 having a horseshoe shape when viewed from above. Such a form can increase the lengths of two legs 274A and 274B, and can make the change of the piezoresistance value larger. In addition, an outside gap 280 which is formed outside the cantilever 272 and an inside gap 282 which is formed inside the cantilever 272 have a round shape as the whole, and accordingly can provide an advantage of being capable of reducing or resolving liquid instability which occurs in a corner portion of the gap.

Incidentally, an air cavity 270 is provided in a lower side of the cantilever 272. The air cavity 270 has a projecting wall 270A which projects inward along a shape between the two legs 274A and 274B when viewed from above. Thereby, a liquid leak and the like which may occur between the two legs 274A and 274B can be effectively prevented. Incidentally, reference numerals 278A and 278B denote extraction electrodes which are connected to the two legs 274A and 274B, respectively. This structure can surely seal both of the outside gap 280 and the inside gap 282 by the liquid. The form of the cantilever 272 shown in FIG. 34 is, of course, one example, and it is desirable to appropriately determine the form of the cantilever 272 according to the use and the like. As for the air cavity 270 as well, the shape can be appropriately determined according to the form of the cantilever 272.

(d) Modified Example 4

Figure 35:
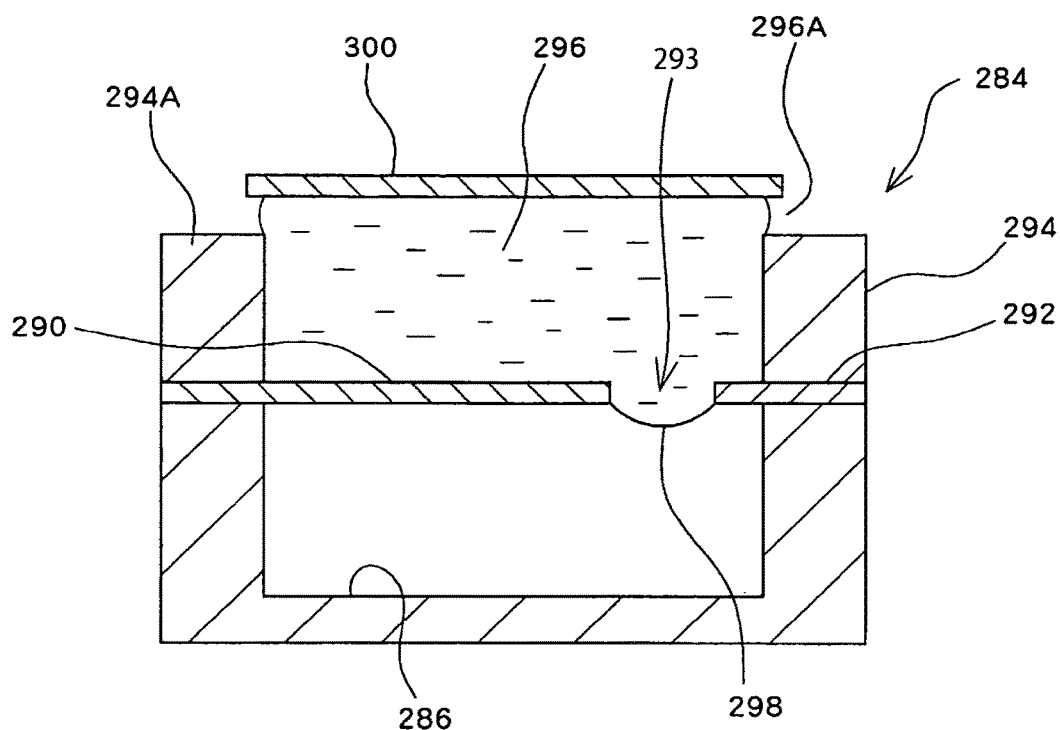
FIG. 35 is a sectional view showing one example of a cantilever protection mechanism.

A modified example will be further described below. FIG. 35 shows a cross-sectional view of a pressure sensor 284 having a cantilever protection mechanism. The pressure sensor 284 has a lower side structure having an air cavity 286, and has an upper side structure having a cantilever 290. A frame 292 is provided around the cantilever. The upper side structure has a container 294 corresponding to the frame body, and a liquid 296 is accommodated in the inside thereof. In a state shown in FIG. 35, the cantilever 290 is in an original attitude. More liquid 296 than an internal volume of the container 294 is accommodated in the container 294, and a part thereof protrudes to the upper side than the upper face level of the container 294. A float plate 300 is placed on the protruding portion. As is denoted by reference numeral 296A, the surface tension of the liquid works in the lower side than the float plate 300 of the protruding portion, and it does not occur that the liquid 296 flows out toward a horizontal direction. A gap 293 between the cantilever 290 and the frame 292 is sealed by the liquid 296, and an interface 298 is formed in the gap.

Figure 36:
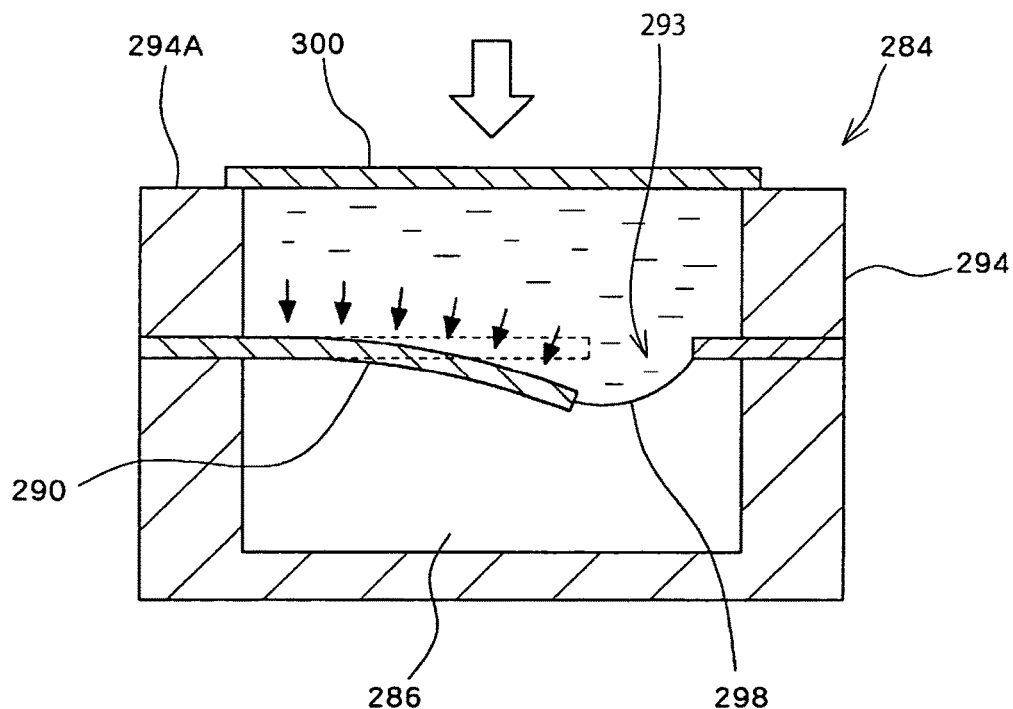
FIG. 36 is a view showing a movement of the cantilever protection mechanism shown in FIG. 35.

FIG. 36 schematically shows a state in which a large pressure is exerted on the pressure sensor 284. When the cantilever 290 is bent and deformed downward by an outside pressure, the interface 298 is deformed, and the upper face level of the liquid 296 moves downward. Along with the movement, the float plate 300 also moves downward. When a peripheral edge of a lower face side of the float plate 300 comes in close contact with the upper face 294A of the container 294, a pressure which is exerted on the cantilever 290 does not further become large, and accordingly the float plate 300 functions like a pressure valve. Accordingly, the pressure sensor 284 can prevent an excessive deformation of the cantilever 290. In the above described structure, it is desirable that the float plate 300 and the upper face 294A of the container 294 are structured so as to come in close contact sufficiently with each other. In addition, it is desirable to provide a guide which guides the rise and fall of the float plate 300 so that the float plate 300 moves without inclination.

Figure 37:
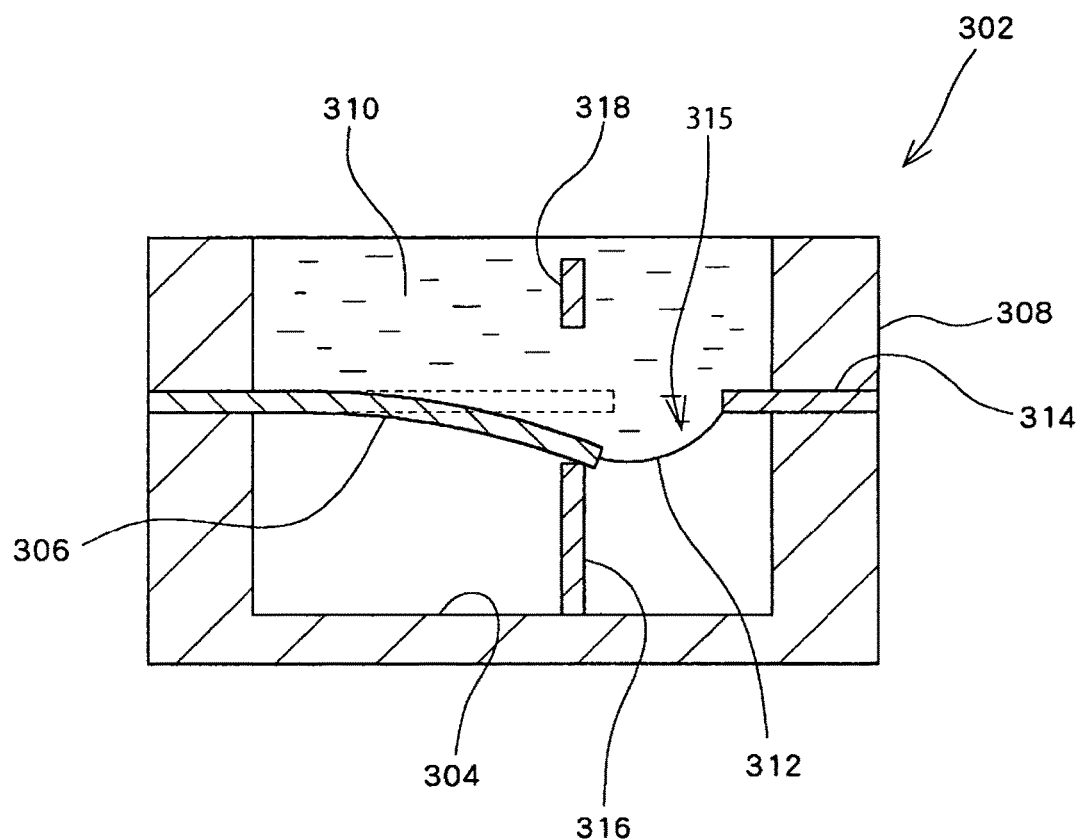
FIG. 37 is a sectional view showing another example of the cantilever protection mechanism.

FIG. 37 shows a pressure sensor 302 having another cantilever protection mechanism. An upper side structure of the pressure sensor 302 has a container 308 which accommodates a liquid 310. A gap 315 is formed between a cantilever 306 and a frame 314, and an interface 312 is formed in the gap 315. In an air cavity 304, a stopper 316 is provided which has such a form as not to prevent the flow of the air. In addition, in the container 308, a stopper 318 is provided which has such a form as not to prevent the flow of the liquid 310. When the cantilever 306 is bent downward to a fixed degree, the lower face of the cantilever 306 touches the upper end of the stopper 316, and a further bend in the cantilever 306 is restricted. When the cantilever 306 is bent upward to a fixed degree, the upper face of the cantilever 306 touches the lower end of the stopper 318, and a further bend in the cantilever 306 is restricted. In other words, a bending range of the cantilever is restricted in both upper and lower directions. Such a direct restriction for the bend can effectively prevent a damage of the cantilever 306 and the like when an excessive pressure has been generated. Various types of mechanisms other than the above described mechanism can be considered as the cantilever protection mechanism. In any case, if the cantilever protection mechanism is provided, the operation reliability of the pressure sensor 302 is enhanced.

(e) Modified Example 5

A sensor array which is a modified example will be described below. It is also possible to array a plurality of hydrophones which are oriented in the same direction or in different directions, and make the hydrophones detect a sound in the water. The sensor array may be used as a sonar. In addition, it is also possible to arrange a plurality of pressure sensors in an array, and structure a stethoscope. The stethoscope is a device which detects sound from circulatory organs, sound from internal organs, sound from muscles, and sound from other living tissues. In any case, it is possible to detect a weak sound with high sensitivity, by the summation of signals sent from the plurality of pressure sensors. The sensor array or a single body of the pressure sensor may also be structured so as to be wearable.

In addition, it is also possible to arrange a plurality of pressure sensors having different characteristics, integrate the outputs and thereby determine the pressure. In the above described embodiment, the air cavity has been completely enclosed by the liquid, but it is also possible to connect a pressure controller shown in FIG. 7 to the air cavity, thereby change a reference pressure and detect an arbitrary absolute pressure with high sensitivity. In such a case as well, the hermetically-closed state of the air cavity is formed.

(f) Modified Example 6

Figure 38:
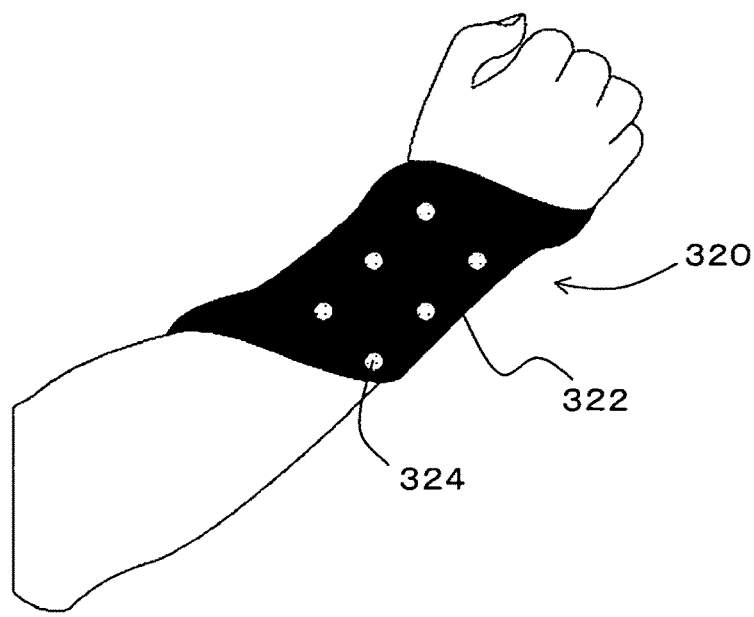
FIG. 38 is a conceptual view showing a wearable stethoscope.

FIG. 38 is a conceptual view showing a wearable stethoscope (hereinafter referred to as "stethoscope") 320 which is a modified example. The stethoscope 320 is a device which is placed, for instance, on a human body, and detects sound from muscles, sound from the internal organs, sound from the circulatory organs, and the like. Such a sound has a frequency, for instance, of 100 Hz or less, and the stethoscope 320 is structured as a device which detects such a sound of a low frequency with adequate sensitivity. As is shown in FIG. 38, the stethoscope 320 has a sheet-shaped portion 322 which is wound around a hand in this example, and a plurality of sensors (sound pressure sensors) 324 which are provided in an array on the sheet-shaped portion 322.

Figure 39:
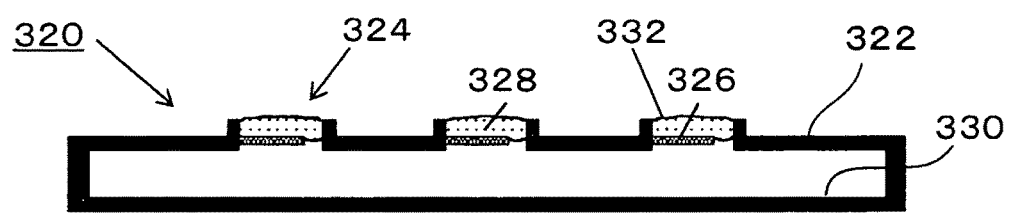
FIG. 39 is a schematic sectional view of the stethoscope shown in FIG. 38.

FIG. 39 shows a schematic sectional view of the stethoscope 320. The sheet-shaped portion 322 is structured as a hollow member, and the inside thereof is a cavity 330 which is commonly used by the plurality of pressure sensors 324. Air, for instance, is enclosed there. In FIG. 39, the plurality of pressure sensors 324 are provided on the upper face (usually, contact face with living body) of the sheet-shaped portion 322. Each of the pressure sensors 324 has a cantilever 326 and a liquid 328 provided on the upper face side thereof. In the illustrated example, a film 332 which covers the liquid 328 is further provided. It is also possible to adopt such a structure that the film is not provided, as long as the sound pressure reaches the cantilever 326. It is also acceptable to provide, for instance, a gelatinous member as the liquid. The member may also be applied onto the surface of the living body. The sound from the inside of the living body reaches the cantilever 326 from the surface of the living body through the film 332 and the liquid 328, and vibrates the cantilever 326. The vibration is detected as the change of the piezoresistance value.

It is desirable that the film 332 is formed so as to come in close contact with the surface of the living body, but it is also possible to provide an acoustic matching layer and the like between the film and the surface of the living body. It is possible to measure a two-dimensional distribution of the sound pressure, on the basis of signals output from the plurality of pressure sensors 324. In addition, it is also possible to measure a phase difference and a time difference among the signals output from the plurality of pressure sensors 324, and specify the position of the sound source. The stethoscope as described above can be placed on various sites other than the hand; and is placed, for instance, on the region of chest when the heart is measured, and is placed on the region of chest and/or the back when breath sounds are measured. It is desirable to use a jig which is suitable for the site to be placed.

2. Second Embodiment (1) Whole Structure

Next, a gas sensor 451 which is a pressure-sensitive sensor according to a second embodiment will be described with reference to the drawings. Incidentally, similar structures to those of the pressure sensor according to the first embodiment are designated by the same reference numerals, and the description is omitted. The gas sensor 451 shown in FIG. 40 which is designated by similar reference numerals corresponding to those in FIG. 2 has a lower side structure 452 and the upper side structure 14. The gas sensor 451 can be used for detecting gases and chemical substances (hereinafter referred to as "gas component") to be detected, such as acetone, ethanol and carbon dioxide.

The lower side structure 452 has a container 456 having an air cavity 454. The container 456 is formed, for instance, of a resin, a semiconductor and another material having airtightness. The air cavity 454 has a recessed shape or a cube shape any of which the upper part is opened, and has a through hole 458 formed in the bottom. A filter 460 is provided in the through hole 458. The filter 460 is formed so as to be capable of passing gas except the gas component to be detected therethrough. The filter 460 can employ, for instance, calcium oxide for carbon dioxide, and can employ activated carbon when being generally used to many types of gas. Thereby, gas except the gas component to be detected freely passes between the outside and the inside of the air cavity 454, through the filter 460.

The liquid expelling region 70 is formed on the surface of the frame 23 in the upper side structure 14. Thereby, a liquid 462 which is provided on an upper face of the upper side structure 14 has a dome-shaped liquid surface 464. The liquid 462 seals the gap 24, and also adsorbs the gas component to be detected.

It is desirable to select a substance which has a large surface tension and is chemically stable as the liquid 462, from the viewpoint of sealing the gap 24. It is desirable to select the liquid 462 which has a low vapor pressure and has adequate handleability. It is desirable that the liquid 462 contains adsorbing molecules which adsorb the gas component to be detected, and that the adsorbing molecules have such properties as to be easy to gather on the liquid surface 464, from the viewpoint of adsorbing the gas component to be detected. It is also acceptable that the liquid 462 contains the adsorbing molecules over all, or that the liquid surface 464 is coated with another liquid which contains the adsorbing molecules.

From the above described viewpoints, in the case where the gas component to be detected is an evaporating gas of acetone and an evaporating gas of ethanol, for instance, a silicone fluidic oil can be used as the liquid 462, and in the case where the gas component to be detected is carbon dioxide gas, an ionic liquid can be used as the liquid 462.

(2) Manufacturing Method

In the gas sensor 451 according to the present embodiment, the upper side structure 14 can be manufactured similarly to that in the first embodiment. The upper side structure 14 and the lower side structure 452 are joined and fixed to each other to be capable of providing the gas sensor 451.

(3) Operation and Effect

Next, an operation and an effect of the gas sensor 451 which has been structured as in the above description will be described. The gas sensor 451 is structured so that outside gases (except gas component to be detected) freely pass through the inside of the air cavity 454, and accordingly pressure in the air cavity 454 and the outside pressure are $P_0$, and are the same. In addition, the weight of the liquid 462 is extremely small as has been described above, and accordingly the gravity which is exerted on the liquid 462 can be neglected. Accordingly, in the gas sensor 451, balance between the internal pressure $P_1$ of the liquid 462 and the outside pressure $P_0$ is kept, and thereby the cantilever 22 is kept in an original attitude. The piezoresistance value of the cantilever 22 at this time shall be an initial value.

Figure 41:
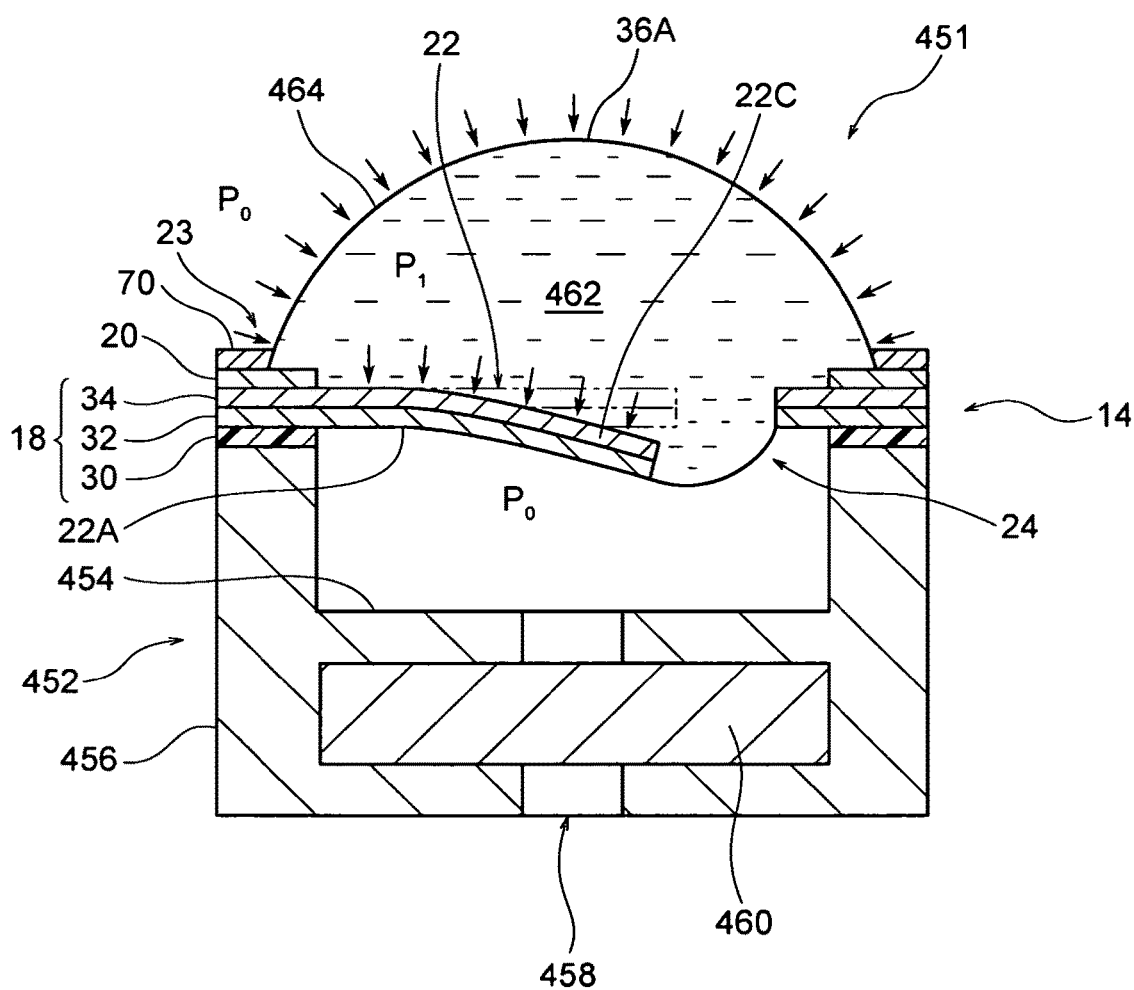
FIG. 41 is a longitudinal sectional view showing a state in which the gas sensor shown in FIG. 40 is used.

Next, as is shown in FIG. 41, the gas sensor 451 is set in an atmosphere containing the gas component to be detected, while the outside pressure $P_0$ is not changed. Then, the liquid 462 adsorbs the gas component to be detected.

Figure 42A:
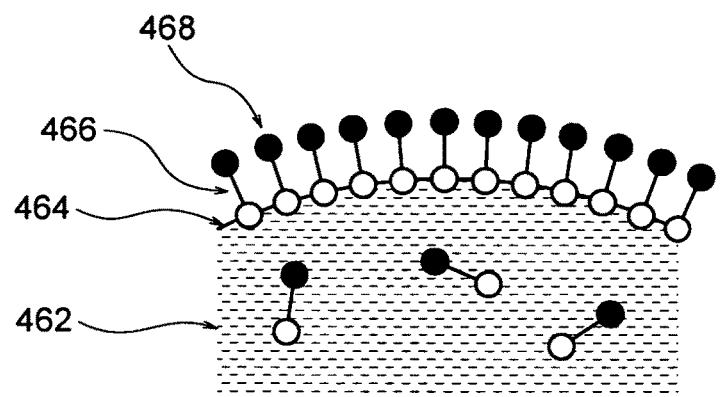
FIG. 42A is a schematic view showing a state before a reaction on the surface of a liquid.
Figure 42B:
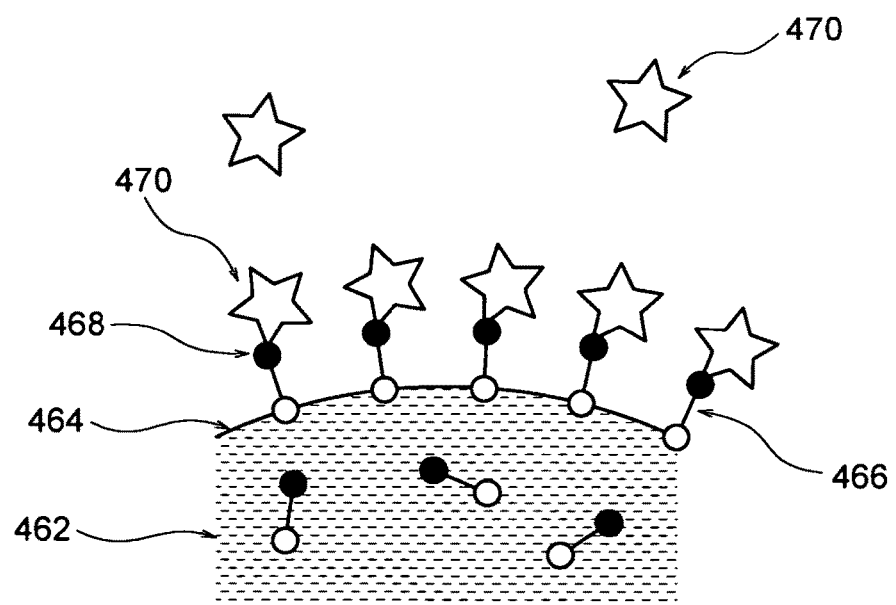
FIG. 42B is a schematic view showing a state after the reaction on the surface of the liquid.

A more detailed description will now be given with reference to FIG. 42. Adsorbing molecules 466 gather on the liquid surface 464 of the liquid 462 (FIG. 42A). The adsorbing molecule 466 has a terminal 468 which can be bonded to the gas component to be detected. Thereby, a molecule 470 of the gas component to be detected bonds to the terminal 468, and thereby the adsorbing molecule 466 adsorbs the gas component to be detected (FIG. 42B). Thereby, the surface tension of the liquid 462 changes. In the case of the present embodiment, the surface tension which changes due to the adsorption of the gas component to be detected is a force exerted from the outside.

The liquid 462 is provided so that the liquid surface 464 forms a shape of one part of a sphere. In addition, suppose that the deformation amount of the cantilever 22 is small and does not affect the shape of the liquid surface 464, a surface tension $\gamma$ of the liquid surface 464 is expressed by the expression of $\Delta P=2\gamma H$, according to the Young-Laplace equation. $\Delta P$ is a pressure difference between the internal pressure $P_1$ and the outside pressure $P_0$ of the liquid 462. H is a curvature of the liquid surface 464, and in the case where the liquid surface 464 forms the shape of a part of the sphere, $H=1/R$ (where R is radius of sphere). Accordingly, the difference ($\Delta P$) between the internal pressure $P_1$ and the outside pressure $P_0$ of the liquid 462 is proportional to the surface tension ($\gamma$).

As has been described above, in the liquid 462, the adsorbing molecules 466 adsorb the gas component to be detected, thereby the surface tension changes, and along with the change, the internal pressure $P_1$ changes. The outside pressure $P_0$ is constant, and accordingly the cantilever 22 is elastically deformed by the internal pressure $P_1$ of the liquid 462 (FIG. 41). The deformation amount of the cantilever 22 can be measured with the detecting circuit, as a degree of the change with respect to the initial value of the piezoresistance value. Thus, the surface tension changes according to the type and the adsorption amount of the gas component to be detected, and the amount of change can be measured with the detecting circuit as the deformation amount of the cantilever 22. Accordingly, the gas sensor 451 detects the gas component to be detected which is physical information on the outside, by the cantilever 22 through the liquid 462, and thereby can detect and measure the gas component to be detected with high sensitivity.

The gas sensor 451 makes the cantilever 22 deform due to the change of the surface tension of the liquid 462, and thereby shall detect and measure the gas component to be detected. The liquid 462 does not need to make the gas component to be detected permeate the whole of the liquid, but adsorbs the gas component to be detected on the liquid surface 464. Thereby, the surface tension changes. Accordingly, the gas sensor 451 can quickly respond to the gas component to be detected.

The gas sensor 451 is structured so that the filter 460 absorbs the gas component to be detected, and thereby prevents the gas component to be detected from flowing into the inside of the air cavity 454. Thereby, the surface tension of the interface of the liquid 462 in the gap 24 does not change. Accordingly, the gas sensor 451 can prevent the surface tension of the interface from canceling the change of the surface tension of the liquid surface 464, and accordingly can enhance the sensitivity, the accuracy and the efficiency of the measurement.

In addition, the gas sensor 451 can be easily repeatedly used, because the gas component to be detected which has adsorbed to the liquid 462 can be separated from the liquid surface 464 by the heating of the liquid 462.

(4) Modified Example

Figure 43:
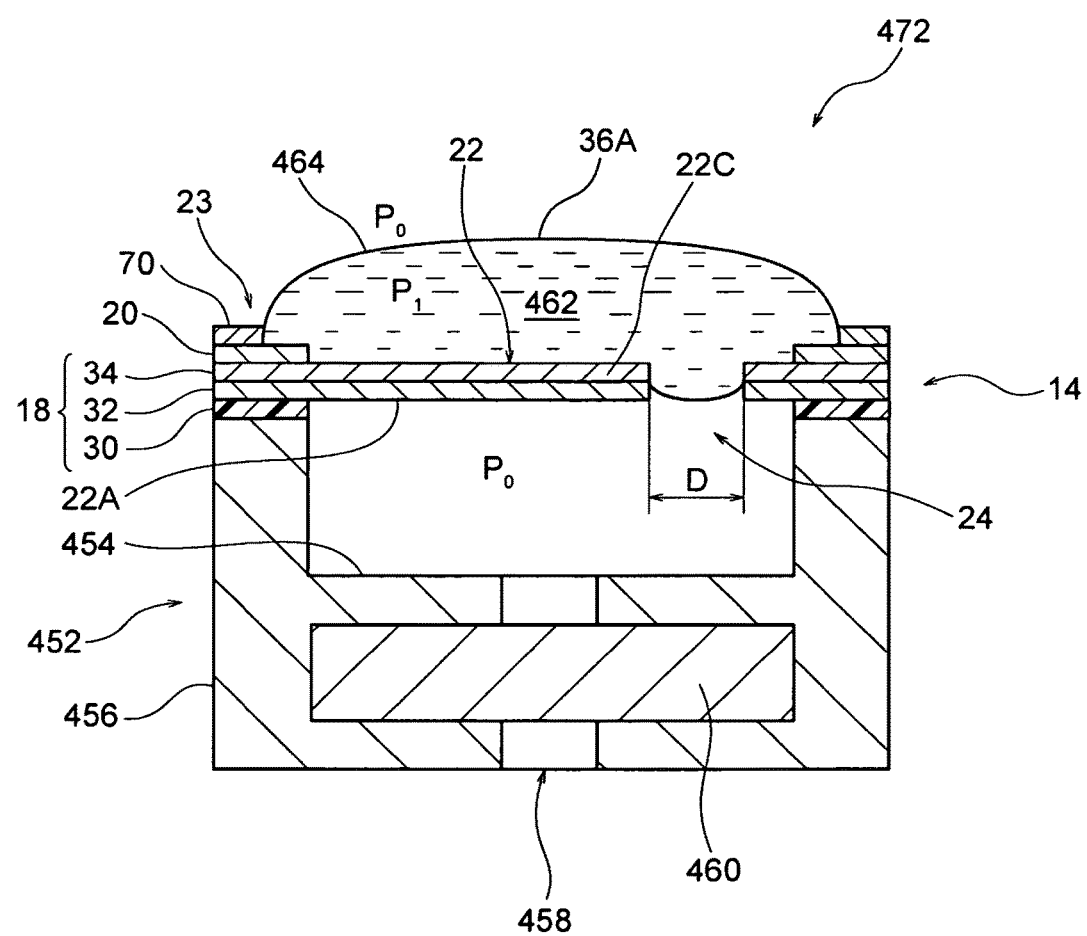
FIG. 43 is a schematic view showing a gas sensor according to a modified example of the second embodiment.

In the case of the present embodiment, the case has been described where the liquid surface 464 is provided so as to form the shape of a part of the sphere, but the present invention is not limited to this case. It is acceptable to provide the liquid surface 464 so as to form a shape of a part of an ellipse, for instance, as is shown in FIG. 43.

The case has been described where the filter 460 is formed so that gases except the gas component to be detected can pass therethrough, but the gas component to be detected is not limited to one type but may be two or more types. In this case, the filter 460 can be formed by stacking a plurality of layers which correspond to the gas components to be detected, respectively.

In the case of the present embodiment, the case has been described where the gas sensor 451 has one lower side structure 452 and one upper side structure 14, but the present invention is not limited to this case. The lower side structure 452 and upper side structure 14 may be arranged to form an array. With such an array arrangement, the gas sensor 451 can enhance a component resolution with respect to the gas component to be detected, and selectivity with respect to a specific gas component when there are a plurality of gas components to be detected.

(5) Evaluation of Characteristics

Figure 40:
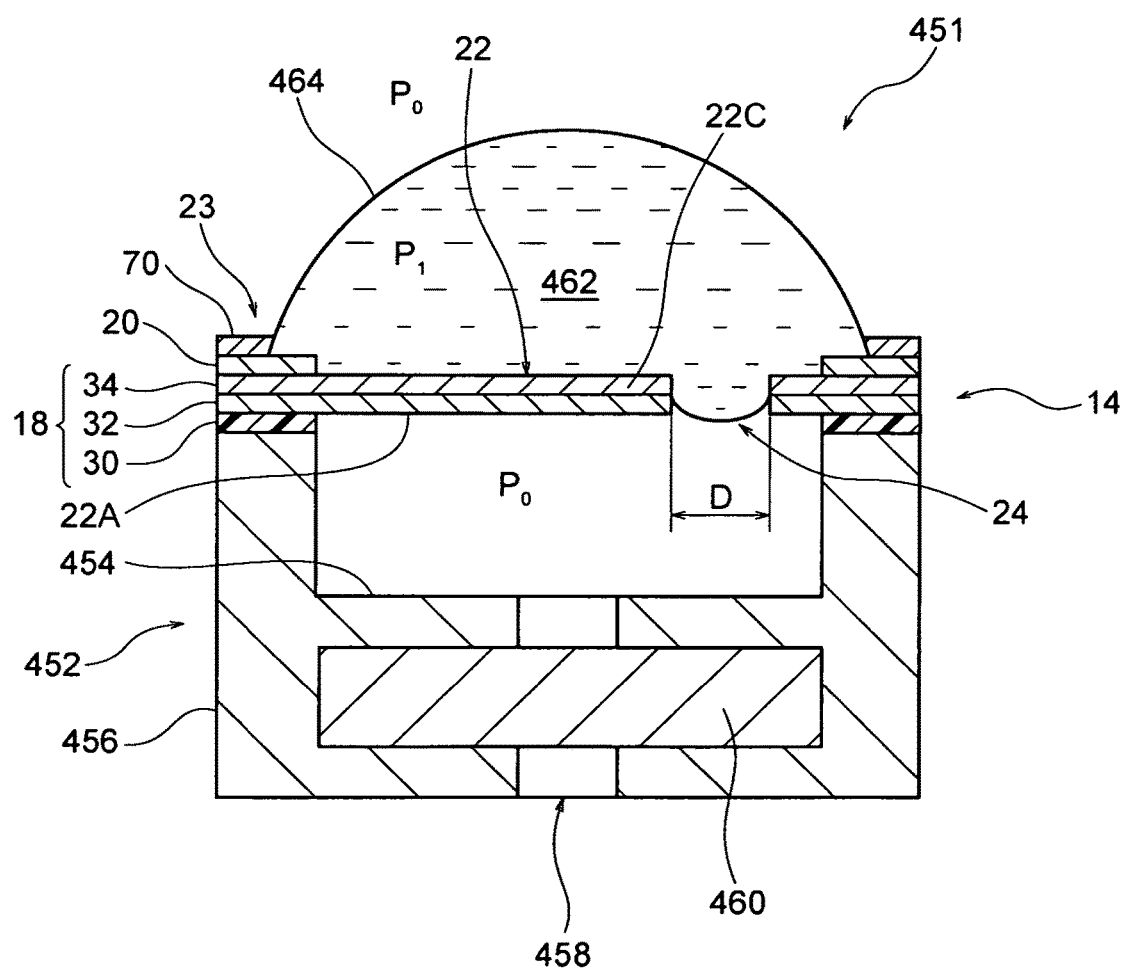
FIG. 40 is a longitudinal sectional view showing a gas sensor according to a second embodiment of the present invention.

The gas sensor which has been used for the evaluation has a structure shown in FIG. 40. The gas sensor has been structured so that the gas component to be detected can be supplied only to the liquid surface. In the gas sensor, the gap has been set at 1 μm, the liquid has been a silicone fluidic oil HIVAC F-4 which is produced by Shin-Etsu Chemical Co., Ltd., and the gas component to be detected has been the evaporating gas of acetone, which has been obtained by evaporating a droplet of acetone. The gas sensor is connected to the detecting circuit shown in FIG. 8.

Figure 44:
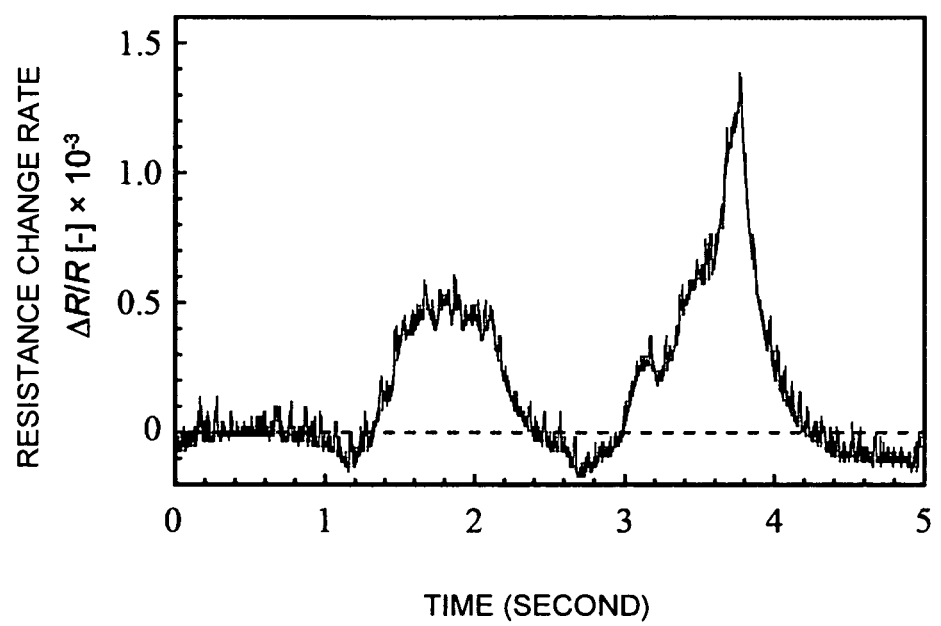
FIG. 44 is a view showing characteristics of the gas sensor according to the second embodiment.

FIG. 44 shows the evaluation result of the gas sensor. In the present figure, a horizontal axis represents a time (second), and a vertical axis represents a change rate ($\Delta R/R$) of a piezoresistance value. As is shown in the present figure, when the gas sensor has been brought close to the evaporating gas of the acetone, the change rate of the piezoresistance value has increased (in figure, peaks in vicinity of 1.8 seconds and in vicinity of 3.8 seconds), and when the gas sensor has been moved away from the evaporating gas of the acetone, the change rate of the piezoresistance value has been lowered. From this result, it has been confirmed that the gas sensor can detect the gas component to be detected with high sensitivity.

3. Third Embodiment

(1) Whole Structure

Next, a gas sensor which is a pressure-sensitive sensor according to a third embodiment will be described. Incidentally, similar structures to those in the second embodiment are designated by the similar reference numerals, and the description is omitted. As for a gas sensor 480 shown in FIG. 45 which is designated by similar reference numerals corresponding to those in FIG. 40, only a lower side structure is different from that in the second embodiment. In the gas sensor 480 according to the present embodiment, the lower side structure is formed of a base 482. The base 482 does not have the air cavity, and accordingly the front face and the rear face of the cantilever 22 are exposed to the same environment. In the case of the present embodiment, the liquid surface 464 is formed so that the surface area thereof becomes sufficiently large as compared to the area of the gap 24. A ratio between the surface area of the liquid surface 464 and the area of the gap 24 is preferably, for instance, approximately 100:1 or more, depending on the type of the liquid 462.

(2) Manufacturing Method

In the gas sensor 480 according to the present embodiment, the upper side structure 14 can be manufactured similarly to that in the first embodiment, and accordingly the description is omitted.

(3) Operation and Effect

Figure 46:
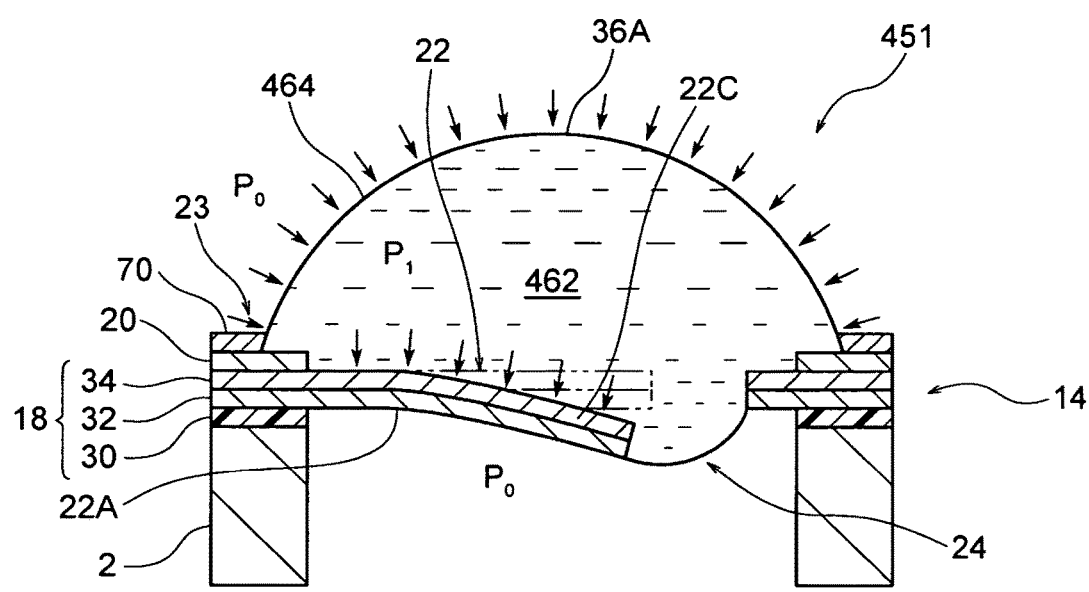
FIG. 46 is a longitudinal sectional view showing a state in which the gas sensor shown in FIG. 45 is used.

In the gas sensor 480 according to the present embodiment, the surface tension of the liquid 462 changes, and thereby the cantilever 22 is deformed (FIG. 46). Thereby, the gas sensor 480 shall detect and measure the gas component to be detected, and accordingly can provide a similar effect to that in the second embodiment.

In addition, in the gas sensor 480 according to the present embodiment, the surface area of the liquid surface 464 is sufficiently large as compared to the area of the gap 24, and accordingly an influence which the surface tension of the interface in the gap 24 exerts on the change of the surface tension of the liquid surface 464 can be made small to a degree of being capable of being neglected. Accordingly, the gas sensor 480 can detect and measure the gas component to be detected even though having omitted the air cavity, the through hole and the filter, and accordingly can simplify its structure correspondingly.

(4) Modified Example

In the case of the present embodiment, the case has been described where the pressure-sensitive sensor is applied to the gas sensor, but the present invention is not limited to the case. The pressure-sensitive sensor can also be applied as a pressure sensor which measures acceleration, a sound pressure and the like. In this case, the pressure sensor can measure the acceleration, the sound pressure and the like, even though having no air cavity, because the liquid transmits the vibration of the outside to the cantilever.

(5) Evaluation of Characteristic

Figure 45:
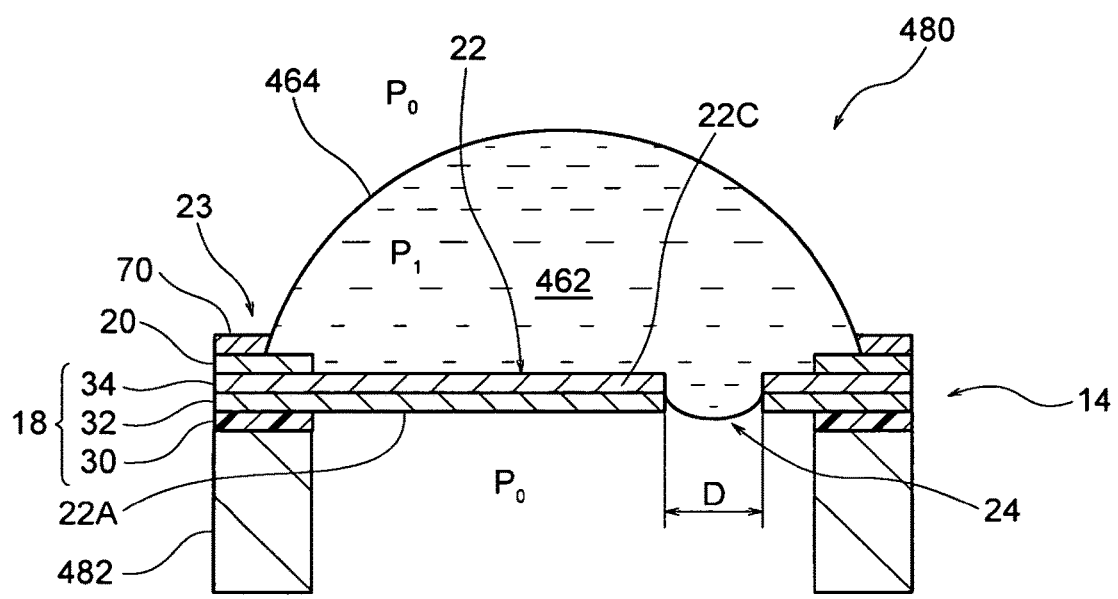
FIG. 45 is a longitudinal sectional view showing a gas sensor according to a third embodiment of the present invention.

The gas sensor which has been used for the evaluation has a structure shown in FIG. 45. Thereby, the front face and the rear face of the cantilever are exposed to the same environment. In the gas sensor, the gap has been set at 1 μm, the liquid has been a silicone fluidic oil HIVAC F-4 which is produced by Shin-Etsu Chemical Co., Ltd., and the gas component to be detected has been the evaporating gas of acetone, which has been obtained by evaporating a droplet of acetone. The gas sensor is connected to the detecting circuit shown in FIG. 8.

Figure 47:
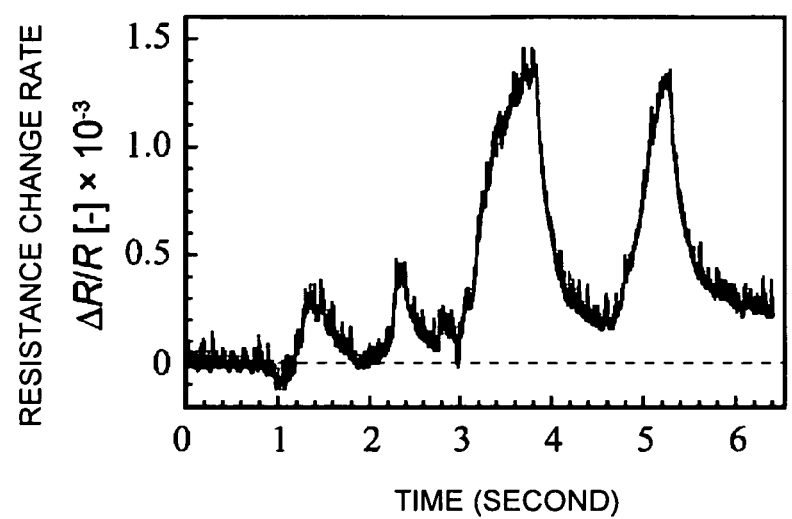
FIG. 47 is a view showing characteristics of the gas sensor according to the third embodiment.

FIG. 47 shows the evaluation result of the gas sensor. In the present figure, a horizontal axis represents a time (second), and a vertical axis represents a change rate ($\Delta R/R$) of a piezoresistance value. As is shown in the present figure, when the gas sensor has been brought close to the evaporating gas of the acetone, the change rate of the piezoresistance value has increased (in figure, peaks in vicinity of 3.5 seconds and in vicinity of 5.2 seconds), and when the gas sensor has been moved away from the evaporating gas of the acetone, the change rate of the piezoresistance value has been lowered. From this result, it has been confirmed that the gas sensor can detect the gas component to be detected with high sensitivity.

As has been described above, the pressure-sensitive sensor according to the embodiment sophisticatedly uses a sealing action of the liquid and can simply seal the gap (confinement of gas), and besides, can reduce a load to be exerted on the cantilever; and accordingly can extremely enhance the sensitivity and the responsibility. Such a pressure-sensitive sensor can be used in various applications in various fields in the industry.

REFERENCE SIGNS LIST 10 pressure sensor, 12 lower side structure, 14 upper side structure, 17 air cavity, 22 cantilever, 23 frame, 24 gap, 28 liquid

The invention claimed is:

1. A pressure-sensitive sensor comprising:
a cantilever;
a frame which is provided around the cantilever and holds a base end of the cantilever;
a gap formed between the cantilever and the frame; and
a liquid which seals the gap.

2. The pressure-sensitive sensor according to claim 1, wherein
the gap is held in a state of being sealed by the liquid, regardless of a deformation of the cantilever.

3. The pressure-sensitive sensor according to claim 1, wherein
a liquid retaining region which includes a surface of the cantilever and the gap, and a liquid expelling region which is formed around the liquid retaining region are provided.

4. The pressure-sensitive sensor according to claim 1, wherein
a gas chamber which is connected to the gap is provided in a rear face side of the cantilever.

5. The pressure-sensitive sensor according to claim 4, wherein
a film having flexibility is provided so as to cover the liquid, and outside pressure is transmitted to the liquid through the film.

6. The pressure-sensitive sensor according to claim 4, wherein
the liquid is provided locally with respect to the gap, and the outside pressure is transmitted directly to the cantilever.

7. The pressure-sensitive sensor according to claim 4, further comprising a protection mechanism which limits the deformation of the cantilever within a fixed range and thereby protects the cantilever.

8. The pressure-sensitive sensor according to claim 1, wherein
a temperature compensation system for compensating temperature characteristics of the cantilever is provided.

9. The pressure-sensitive sensor according to claim 8, wherein
the temperature compensation system has a non-deforming type dummy cantilever that has characteristics similar to resistance variation characteristics with respect to temperature, which the cantilever has.

10. The pressure-sensitive sensor according to claim 4, wherein
the pressure-sensitive sensor is arranged in a liquid tank and detects a pressure which travels in the liquid in the liquid tank.

11. The pressure-sensitive sensor according to claim 10, wherein
the pressure-sensitive sensor is a hydrophone which detects a sound wave that travels in the liquid.

12. The pressure-sensitive sensor according to claim 11, wherein
the hydrophone has a sound guide which guides the sound wave to the cantilever.

13. A sensor array, wherein
the pressure-sensitive sensors according to claim 1 are arrayed one-dimensionally or two-dimensionally.

14. The pressure-sensitive sensor according to claim 1, wherein
the liquid has an adsorbing molecule which adsorbs a gas component to be detected, on a liquid surface.

15. The pressure-sensitive sensor according to claim 14, further comprising:
a gas chamber which is formed in a rear face side of the cantilever so that gas can flow through the gap;
a through hole which connects the inside of the gas chamber and the outside; and
a filter which is provided in the through hole and through which gases except the gas component to be detected can pass.

16. A method of using a pressure-sensitive sensor, in which the pressure-sensitive sensor includes:
a cantilever;
a frame which is provided around the cantilever and holds a base end of the cantilever; and a gap formed between the cantilever and the frame, the method comprising:
a step of sealing the gap by a liquid so that an interface of the liquid in the gap stays inside or in a vicinity of the gap, regardless of a deformation of the cantilever, and thereby maintaining a sealed state of the gap; and
a step of detecting the deformation of the cantilever, which occurs due to a force exerted from the outside, in the sealed state, as a change of electrical characteristics that the cantilever has.

* * * * *